(12) United States Patent
Chen et al.

(10) Patent No.: US 11,856,788 B2
(45) Date of Patent: Dec. 26, 2023

(54) SEMICONDUCTOR DEVICE AND METHOD OF FABRICATING THE SAME

(71) Applicant: TAIWAN SEMICONDUCTOR MANUFACTURING COMPANY, LTD., Hsinchu (TW)

(72) Inventors: Tzu-Yu Chen, Kaohsiung (TW); Sheng-Hung Shih, Hsinchu (TW); Fu-Chen Chang, New Taipei (TW); Kuo-Chi Tu, Hsinchu (TW); Wen-Ting Chu, Kaohsiung (TW); Alexander Kalnitsky, San Francisco, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/192,227

(22) Filed: Mar. 4, 2021

(65) Prior Publication Data
US 2022/0285376 A1 Sep. 8, 2022

(51) Int. Cl.
*H01L 21/00* (2006.01)
*H10B 53/30* (2023.01)
*H01L 49/02* (2006.01)

(52) U.S. Cl.
CPC ............. *H10B 53/30* (2023.02); *H01L 28/60* (2013.01)

(58) Field of Classification Search
CPC ................................. H10B 53/30; H01L 28/60
See application file for complete search history.

(56) References Cited

U.S. PATENT DOCUMENTS

| | | | |
|---|---|---|---|
| 2006/0244023 A1* | 11/2006 | Kanaya | H10B 53/30 257/295 |
| 2020/0105772 A1 | 4/2020 | Chen et al. | |
| 2021/0035992 A1 | 2/2021 | Chen et al. | |
| 2021/0035993 A1 | 2/2021 | Chen et al. | |

* cited by examiner

*Primary Examiner* — Richard A Booth
(74) *Attorney, Agent, or Firm* — Birch, Stewart, Kolasch & Birch, LLP

(57) ABSTRACT

A method for fabricating a semiconductor device is provided. The method includes depositing a bottom electrode layer over a substrate; depositing a ferroelectric layer over the bottom electrode layer; depositing a first top electrode layer over the ferroelectric layer, wherein the first top electrode layer comprises a first metal; depositing a second top electrode layer over the first top electrode layer, wherein the second top electrode layer comprises a second metal, and a standard reduction potential of the first metal is greater than a standard reduction potential of the second metal; and removing portions of the second top electrode layer, the first top electrode layer, the ferroelectric layer, and the bottom electrode layer to form a memory stack, the memory stack comprising remaining portions of the second top electrode layer, the first top electrode layer, the ferroelectric layer, and the bottom electrode layer.

20 Claims, 33 Drawing Sheets

SEMICONDUCTOR DEVICE AND METHOD OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
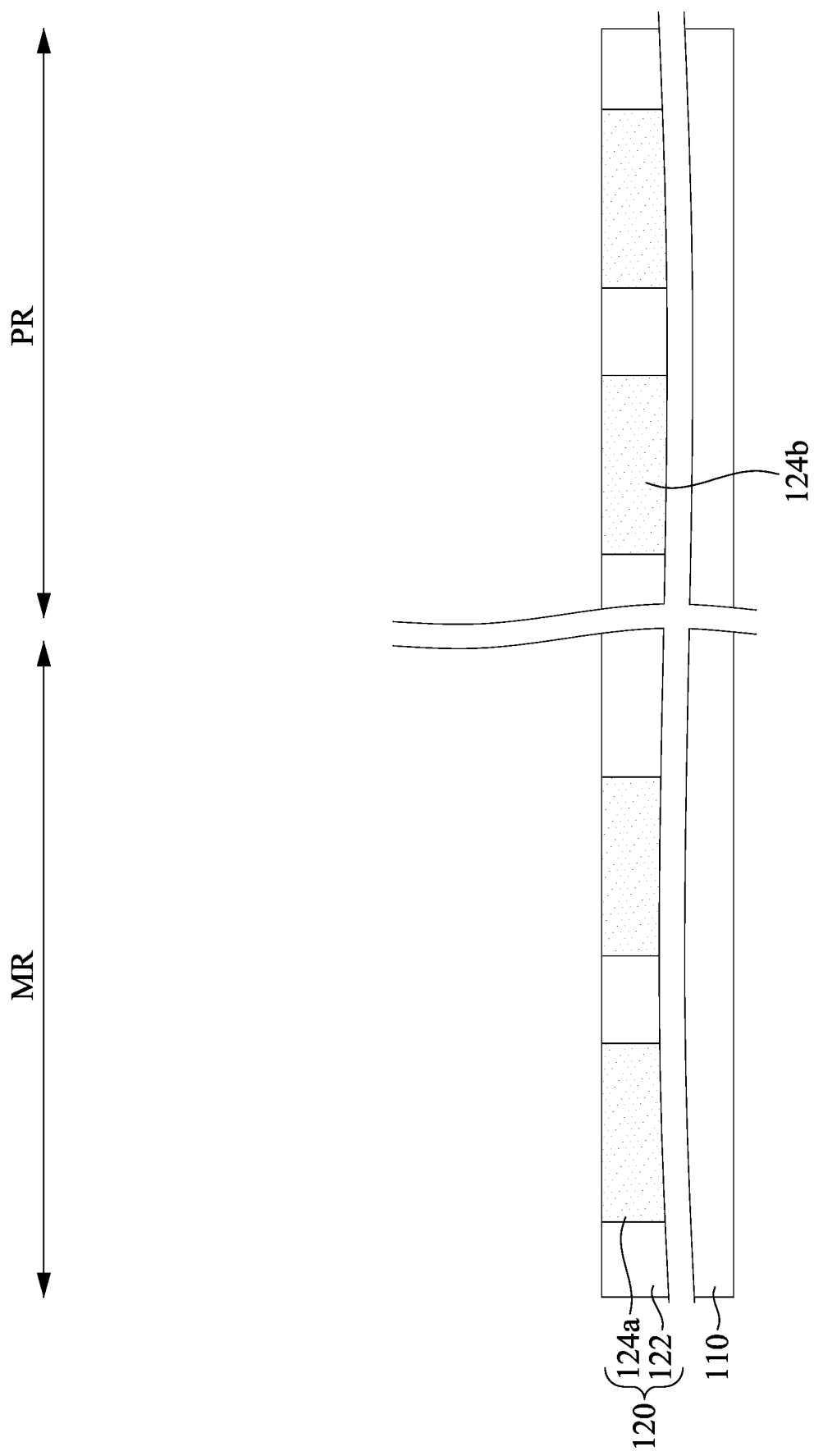
FIGS. 1 through 13 illustrate an integrated circuit device having a memory cell at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FeRAM) is a non-volatile memory, in which data are stored using hysteretic P-E (polarization vs. electric field) characteristics in a ferroelectric film. For example, ferroelectric materials in the ferroelectric film are electrically polarizable materials that possess at least two polarization states, which polarization states may be switched by the application of an external electric field. Each polarization state of ferroelectric materials remains stable even after the removal of the applied electric field for at least some period of time. Due to this stability of polarization states, ferroelectric materials have been used for memory applications. One of the polarization states is considered to be a logic "1" and the other state a logic "0." Ferroelectric materials have a non-linear relationship between the applied electric field and the apparent stored charge, resulting in a ferroelectric characteristic in the form of a hysteresis loop.

Ferroelectric materials, such as hafnium zirconium oxide (HZO), lead zirconate titanate (PZT), strontium bismuth tantalite (SBT), doped hafnium oxide (Si:$HfO_2$), barium titanate (BaTiO3), hafnium oxide ($HfO_2$), and zirconium oxide ($ZrO_2$) are widely used in the ferroelectric film. The functional properties of these ferroelectric materials are linked to their crystal structures and phases. That is to say, ferro phase, which may relate to non-centrosymmetric and polar crystal structures, may demonstrate its ferroelectric behavior. For example, HZO in orthorhombic phase have a non-linear relationship/response between the applied electric field and the apparent stored charge, resulting in a ferroelectric characteristic in the form of a hysteresis loop. Through the design, the polarization states in the ferroelectric film of the FRAM cell may determine data '0' and '1'.

An integrated circuit device having the FeRAM cells and the method of fabricating the same are provided in accordance with various exemplary embodiments. The intermediate stages of forming the integrated circuit device are illustrated. The variations of the embodiments are discussed. Throughout the various views and illustrative embodiments, like reference numbers are used to designate like elements.

FIGS. 1 through 13 illustrate an integrated circuit device having a memory cell at various stages of fabrication in accordance with some embodiments of the present disclosure. It is understood that additional operations may be provided before, during, and after the operations shown by FIGS. 1 through 13, and some of the operations described below can be replaced or eliminated for additional embodiments of the method. The order of the operations/processes may be interchangeable.

Referring to FIG. 1, one or more interconnect layers 120 are formed over a substrate 110. The substrate 110 has a peripheral region PR where logic devices or passive devices are to be formed, and a memory region MR where memory cells are to be formed. The substrate 110 may be a silicon substrate. Alternatively, the substrate 110 may comprise another elementary semiconductor, such as germanium; a compound semiconductor including silicon carbide; an alloy semiconductor including silicon germanium; or combinations thereof. In some embodiments, the substrate 110 is a semiconductor on insulator (SOI) substrate. The substrate may include doped regions, such as p-wells and n-wells. In the present embodiments, a wafer is a workpiece that includes a semiconductor substrate and various features formed in and over and attached to the semiconductor substrate. The wafer may be in various stages of fabrication and is processed using the CMOS process. The transistors are formed by suitable transistor fabrication processes and may be a planar transistor, such as polysilicon gate transistors or high-k metal gate transistors, or a multi-gate transistor, such as fin field effect transistors.

After the transistors are formed, one or more interconnect layers 120 of a multi-level interconnect (MLI) is formed over the transistors. The interconnect layer 120 includes one or more conductive features 124a and 124b embedded in inter-layer dielectric (ILD) layer 122. The ILD layer 122 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The conductive features 124a and 124b may be aluminum, aluminum alloy, copper, copper alloy, titanium, titanium nitride, tantalum, tantalum nitride, tungsten, cobalt, the like, and/or combinations thereof. Formation of the conductive features 124a and 124b and the ILD layer 122 may be a dual-damascene process and/or a single-damascene process. For example, trench openings are etched in the ILD layer 122, and then the conductive materials are deposited into the openings in the ILD layer 122 using CVD, PVD (e.g., sputtering deposition), ALD, the like, and/or a combination thereof. Subsequently, a portion of the conductive materials out of the openings in the ILD layer 122 are removed by suitable planarization process, such as a chemical-mechanical polish (CMP) process. The substrate 110 may also include active and passive devices, for example, underlying the interconnect layer 120. These further components are omitted from the figures for clarity.

Figure 2:
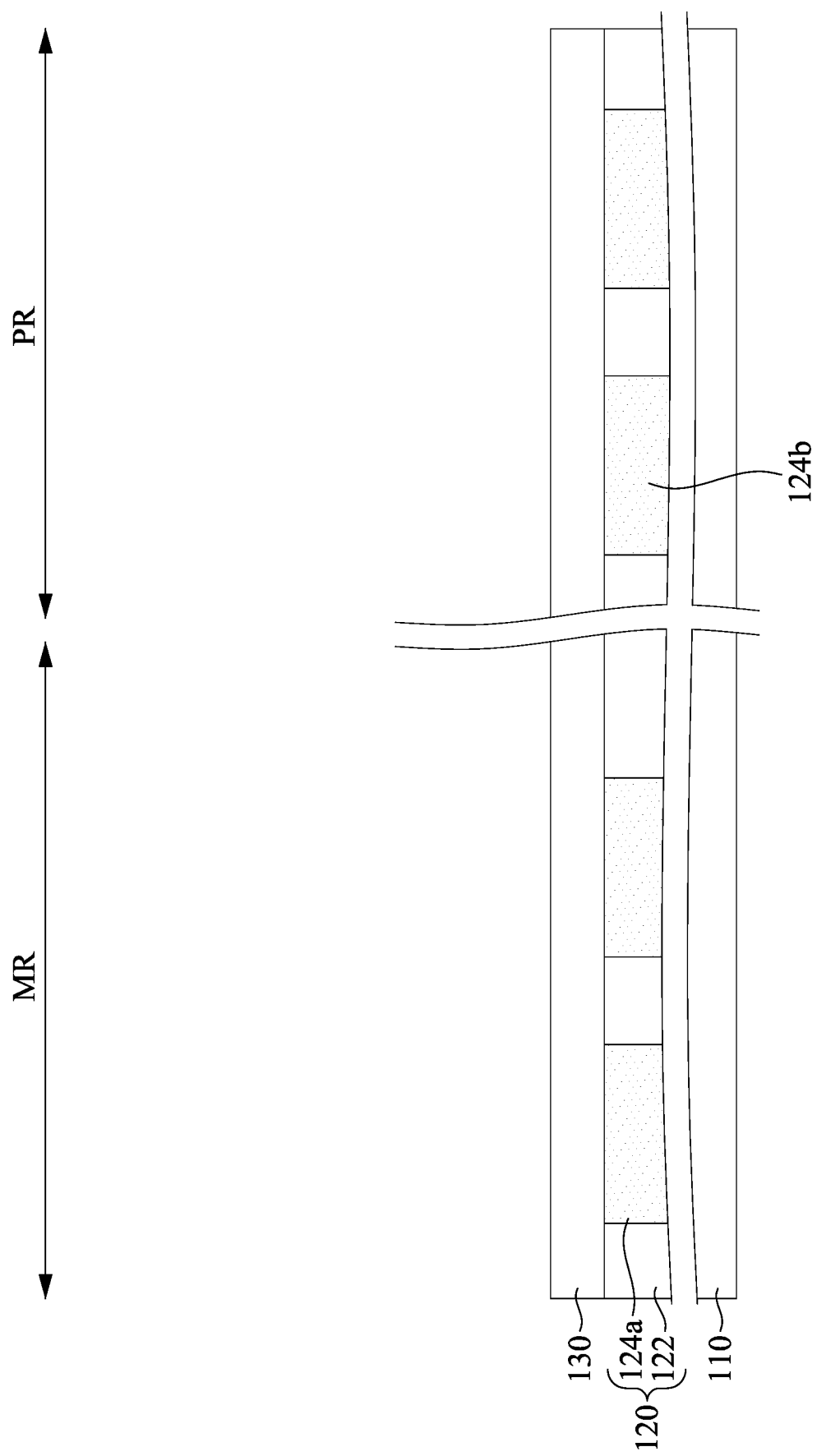

Referring to FIG. 2, a dielectric layer 130 is formed over the interconnect layer 120. The dielectric layer 130 in some embodiments is silicon carbide (SiC), silicon oxynitride (SiON), silicon nitride (SiN), silicon dioxide, the like, and/or combinations thereof. The dielectric layer 130 may be a single-layered structure or a multi-layered structure. The dielectric layer 130 may be formed by acceptable deposition techniques, such as chemical vapor deposition (CVD), atomic layer deposition (ALD), physical vapor deposition (PVD), the like, and/or a combination thereof. In some embodiments, a thickness of the dielectric layer 130 is in a range from about 150 angstroms to about 350 angstroms. If the dielectric layer 130 is less than about 150 angstroms, the dielectric layer 130 may not serve as a etch stop layer during the following etching process. If the dielectric layer 130 is greater than about 350 angstroms, it may unnecessarily reduce the vertical space to accommodate embedded memory cells, such that the fabrication process of the memory cell may not be compatible with logic process.

Figure 3:
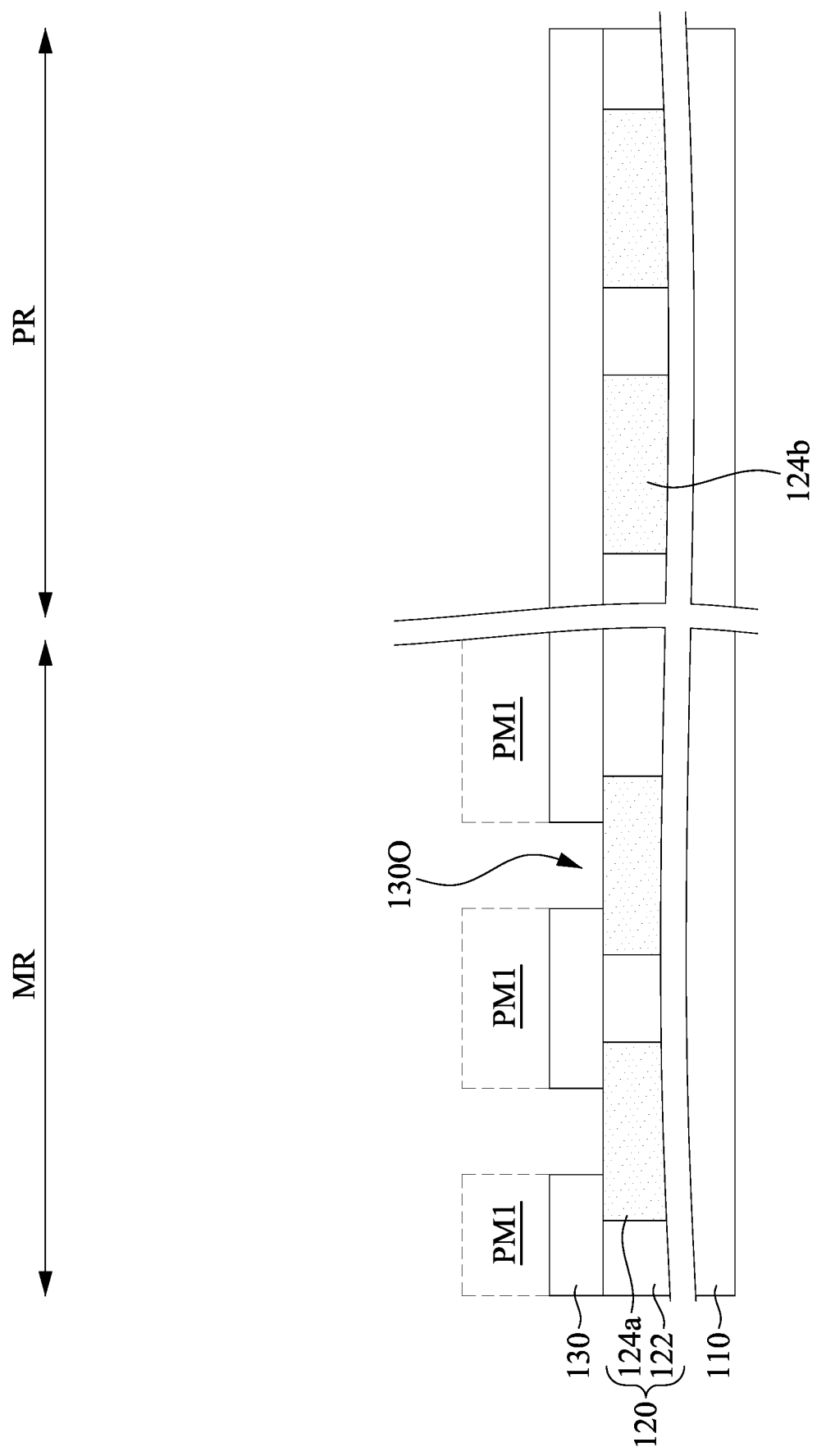

Reference is made to FIG. 3. The dielectric layer 130 may be patterned to have openings 130O exposing portions of the conductive features 124a in the memory region MR. An exemplary formation method of the openings 130O includes forming a patterned resist layer PM1 over the dielectric layer 130, and then etching the dielectric layer 130 through the patterned resist layer PM1 by one or more etching processes.

For example, a resist layer is formed over the dielectric layer 130 (referring to FIG. 3) and patterned using suitable photolithography process, thereby forming the patterned resist layer PM1. For example, the process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the patterned resist layer PM1 is an ashing removable dielectric (ARD), which is a photoresist-like material generally having generally the properties of a photoresist and amendable to etching and patterning like a photoresist. The patterned resist layer PM1 may also acts as a mask layer for etching or patterning underlying layers. In some embodiments, the patterned resist layer PM1 includes an organic material, such as polymer. In some embodiments, the patterned resist layer PM2 includes SiON. The patterned resist layer PM2 may be formed by spin-on coating, CVD, PVD, ALD, or other suitable processes.

Subsequently, an etching process is performed to etch the dielectric layer 130 (referring to FIG. 2), such that portions of the dielectric layer 130 (referring to FIG. 2) uncovered by the patterned resist layer PM1 are removed. The remaining portions of the dielectric layer 130 (referring to FIG. 2) has the openings 130O. The etching process may be a dry etch using suitable etchants. The conductive features 124a and the patterned resist layer PM1 may have a higher etch resistance to the etchants than that of the dielectric layer 130, thereby protecting underlying layers from being etched.

Figure 4:
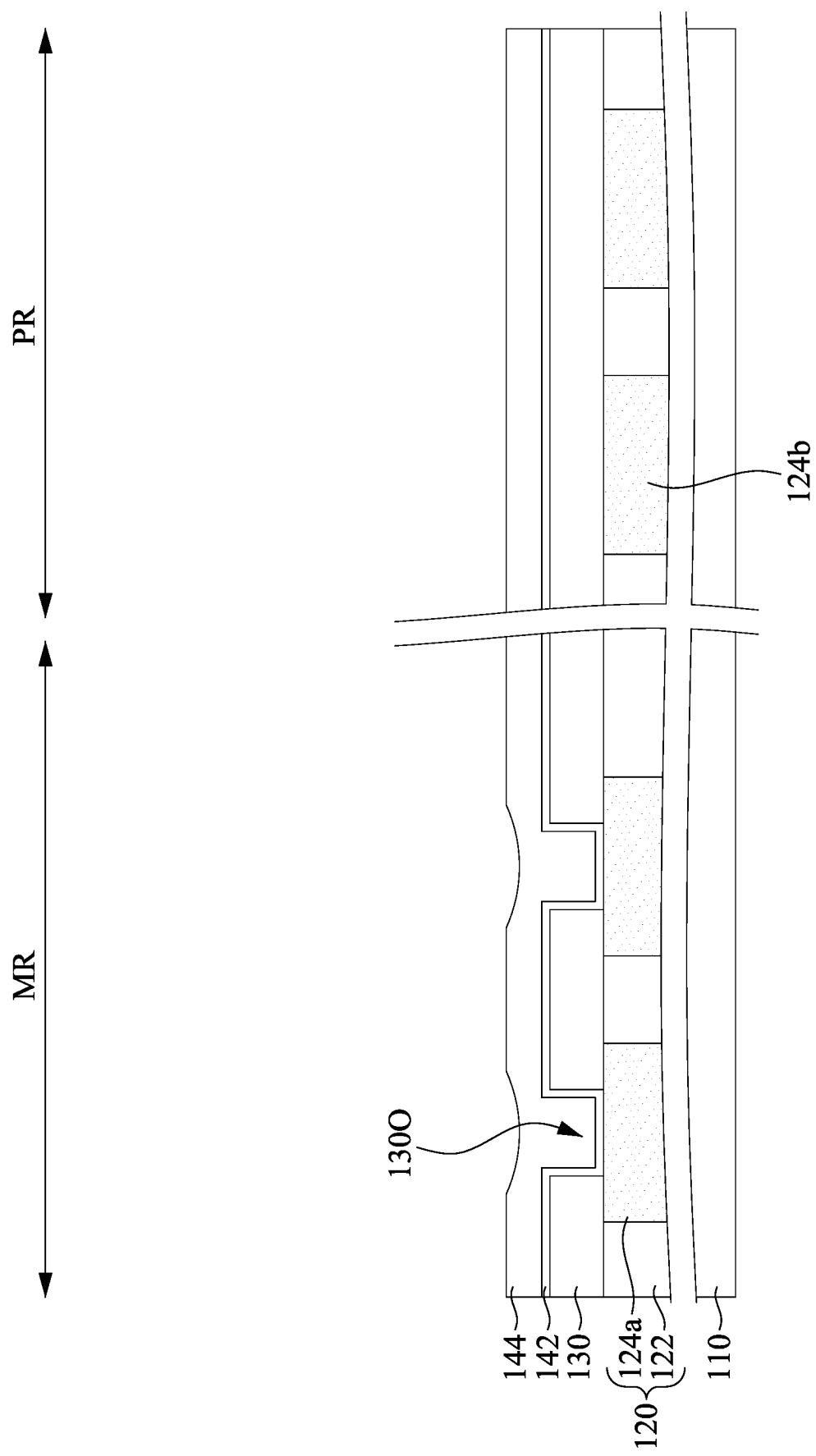

Reference is made to FIG. 4. The openings 130O in the dielectric layer 130 may be overfilled with a diffusion barrier layer 142 and a fill metal 144. In some embodiments, the diffusion barrier layer 142 is a titanium nitride (TiN) layer or a tantalum nitride (TaN) layer, which can act as a suitable barrier to prevent metal diffusion. Formation of the diffusion barrier layer 142 may be exemplarily performed using CVD, PVD (e.g., sputtering deposition), ALD, the like, and/or a combination thereof. In some embodiments, the filling metal 144 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 144 may be exemplarily performed using CVD, PVD (e.g., sputtering deposition), ALD, the like, and/or a combination thereof.

In some embodiments, a thickness of the diffusion barrier layer 142 is in a range from about 50 angstroms to about 200 angstroms. If the diffusion barrier layer 142 is less than about 50 angstroms, the diffusion barrier layer 142 may not effectively stop metal diffusion. If the diffusion barrier layer 142 is greater than about 200 angstroms, the recess in the diffusion barrier layer 142 may have a higher aspect ratio, which may increase the difficulty in filling the fill metal 144 in the recess.

Figure 5:
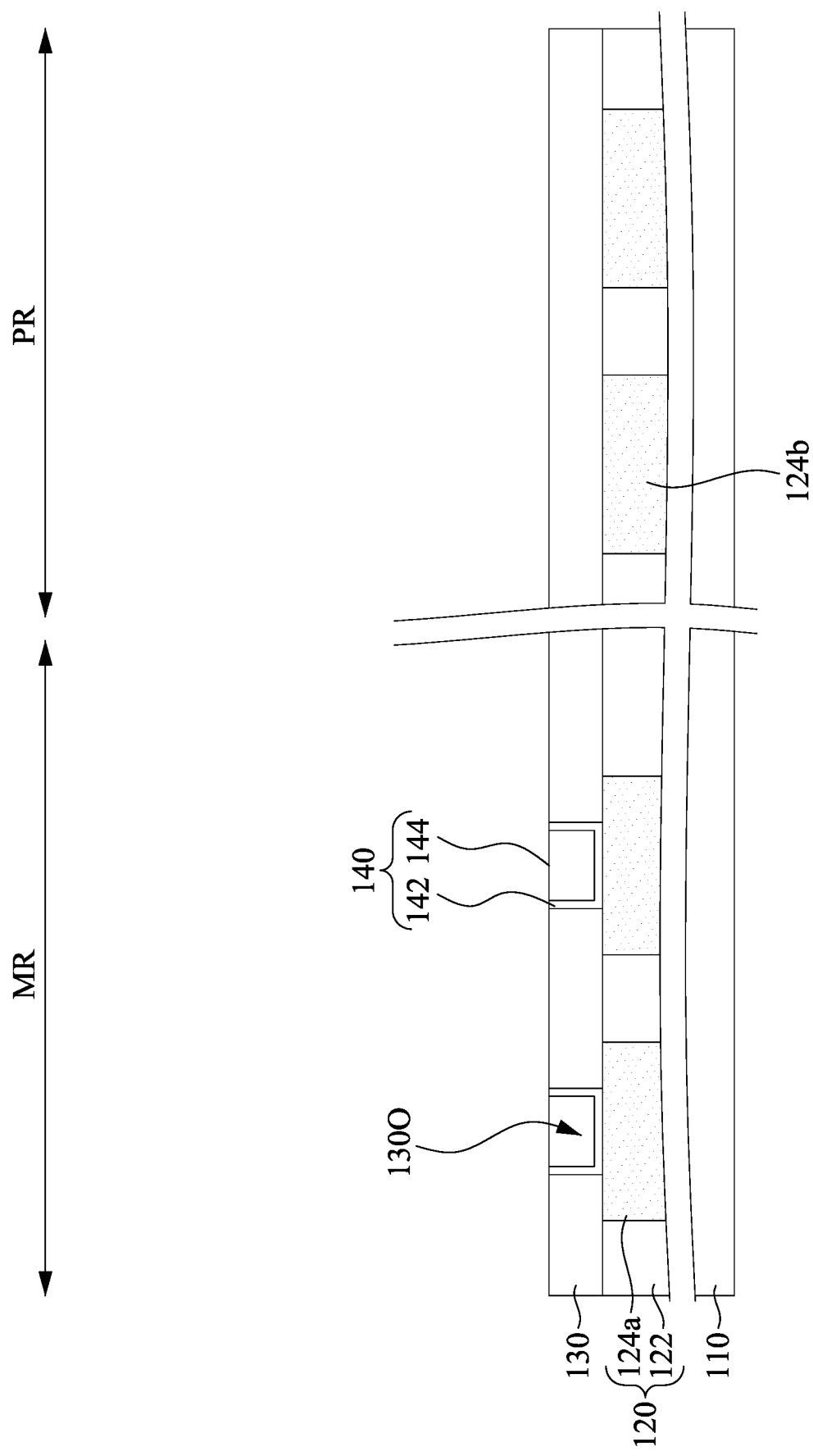

Reference is made to FIG. 5. A planarization process, such as a CMP process, is performed to remove excess materials of the diffusion barrier layer 142 and the fill metal 144 outside the openings 130O in the dielectric layer 130. The remaining diffusion barrier layer 142 and the remaining fill metal 144 in the openings 130O in the dielectric layer 130 can serve as the bottom electrode vias (BEVA) 140. In some embodiments, the BEVAs 140 are electrically connected to an underlying electrical component, such as a transistor, through the conductive features 124a.

Figure 6:
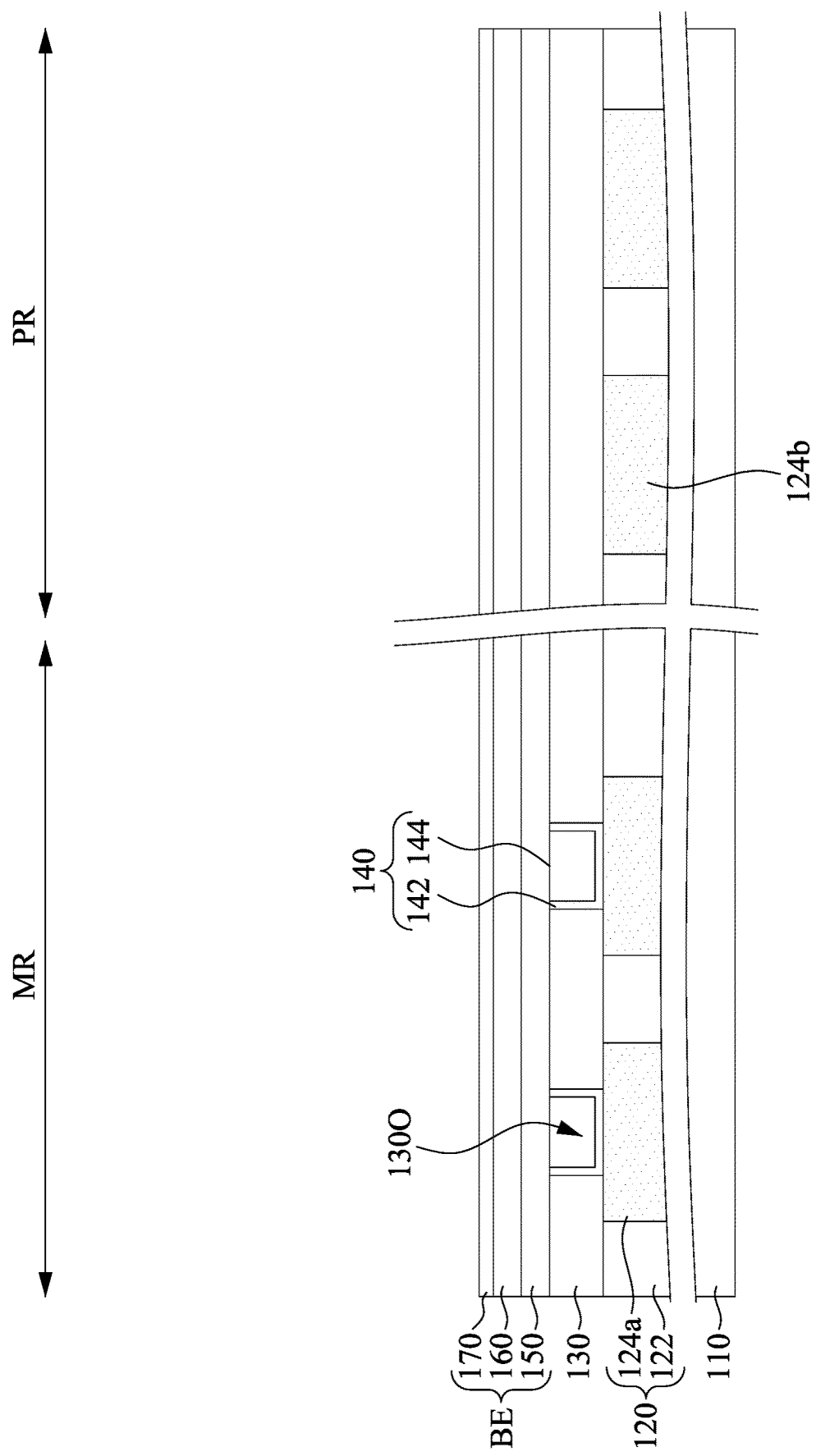

Reference is made to FIG. 6. A bottom electrode stack layer BE is formed over the BEVAs 140 and over the dielectric layer 130. The bottom electrode stack layer BE may include a first bottom electrode layer 150 and a second bottom electrode layer 160 over the first bottom electrode layer 150.

The first bottom electrode layer ISO may include one or more suitable conductive materials. For example, the first bottom electrode layer 150 may include non-platinum group metals or non-noble metals, such as titanium (Ti), tantalum (Ta), tungsten (W), aluminum (Al), copper (Cu), TiN, TaN, the like, and/or a combination thereof. The first bottom electrode layer 150 can be a single-layered structure or a multi-layered structure. Formation of the first bottom electrode layer 150 may be exemplarily performed using CVD, PVD (e.g., sputtering deposition), ALD, the like, and/or a combination thereof.

In some embodiments, the second bottom electrode layer 160 may include a conductive material which can act as a suitable barrier to prevent metal diffusion to the ferroelectric layers later formed. For example, the second bottom electrode layer 160 may include noble metals, such as Ru, Rh, Pd, Os, Ir, Pt, Au, Ag, the like, or the combination thereof. In some embodiments, the second bottom electrode layer 160 may include platinum-group metals, such as Ru, Rh, Pd, Os, Ir, Pt, the like, or the combination thereof. The second bottom electrode layer 160 can be a single-layered structure or a multi-layered structure. Formation of the second bottom electrode layer 160 may be exemplarily performed using CVD, PVD (e.g., sputtering deposition), ALD, the like, and/or a combination thereof. In some embodiments, a thickness of the second bottom electrode layer 160 may be greater than about 5 nanometers. If the second bottom electrode layer 160 is less than about 5 nanometers, the second bottom electrode layer 160 may not well avoid metal diffusion from the first bottom electrode layer 150 to the ferroelectric layer formed later.

For example, a standard reduction potential of a metal of the second bottom electrode layer 160 is greater than a standard reduction potential of a metal of the first bottom electrode layer 150. For example, in some embodiments, the first bottom electrode layer 150 includes non-noble metals or non-platinum group metals, and the second bottom electrode layer 160 includes noble metals or platinum group metals. Through the configuration, the second bottom electrode layer 160 is more resistant to metal diffusion than the first bottom electrode layer 150 is. Also, the second bottom electrode layer 160 is more resistant to be oxidized than the first bottom electrode layer 150 is. In some other embodiments, the configuration of the BEVAs 140 can be omitted, and the first bottom electrode layer 150 or a combination of the first bottom electrode layer 150 and the second bottom electrode layer 160 may be deposited to be in contact with the conductive features 124a. In some embodiments, the first bottom electrode layer 150 may be omitted, and the bottom electrode stack layer BE may include just the second bottom electrode layer 160. In some embodiments, the second bottom electrode layer 160 may be spaced apart from the conductive feature 124a, for example, by the first bottom electrode layer 150, the BEVAs 140, and the dielectric layer 130.

In some embodiments, the bottom electrode stack layer BE may further include a bottom metal-containing compound layer 170 formed over the surface of the second bottom electrode layer 160. The bottom metal-containing compound layer 170 may include suitable metal oxides, in which the metal of the metal oxides has a standard reduction potential greater than the standard reduction potential of the metal of the first bottom electrode layer 150. For example, the bottom metal-containing compound layer 170 may include platinum-group metal oxides, such as $RuO_x$, $RhO_x$, $PdO_x$, $OsO_x$, $IrO_x$, $PtO_x$. In some embodiments, a thickness of the bottom metal-containing compound layer 170 may be in a range from about 0 nanometer to about 5 nanometers. If the bottom metal-containing compound layer 170 is greater than about 5 nanometers, the electrical resistance of the formed memory cells may unnecessarily increase. In some embodiments, the bottom metal-containing compound layer 170 may be omitted from the bottom electrode stack layer BE.

In some embodiments, formation of the bottom metal-containing compound layer 170 may include performing an oxide treatment to oxidize a surface layer of the second bottom electrode layer 160, such that the oxidized surface layer forms the bottom metal-containing compound layer 170. The oxide treatment may include a heat annealing process. As a result, the bottom metal-containing compound layer 170 may include a metal element the same as that of the second bottom electrode layer 160. For example, the second bottom electrode layer 160 includes Ru, and the bottom metal-containing compound layer 170 includes $RuO_x$. For example, the second bottom electrode layer 160 includes Rh, and the bottom metal-containing compound layer 170 includes $RhO_x$.

In some embodiments, formation of the bottom metal-containing compound layer 170 may include suitable deposition process, such as PVD, ALD, or the combination thereof. For example, suitable metal may be deposited over the second bottom electrode layer 160, and then an oxide treatment is performed to oxidize a surface layer of the second bottom electrode layer 160 into the bottom metal-containing compound layer 170. Alternatively, suitable metal-containing compound materials (e.g., metal oxides) may be deposited over the second bottom electrode layer 160, thereby forming the bottom metal-containing compound layer 170. Through these processes, the bottom metal-containing compound layer 170 may include a metal element different from that of the second bottom electrode layer 160. For example, the second bottom electrode layer 160 includes Ru, and the bottom metal-containing compound layer 170 includes $RhO_x$. For example, the second bottom electrode layer 160 includes Rh, and the bottom metal-containing compound layer 170 includes $RuO_x$. Alternatively, in some other embodiments, through these processes, the bottom metal-containing compound layer 170 may include the same metal element as that of the second bottom electrode layer 160. For example, the second bottom electrode layer 160 includes Ru, and the bottom metal-containing compound layer 170 includes $RuO_x$. For example, the second bottom electrode layer 160 includes Rh, and the bottom metal-containing compound layer 170 includes $RhO_x$.

Figure 7:
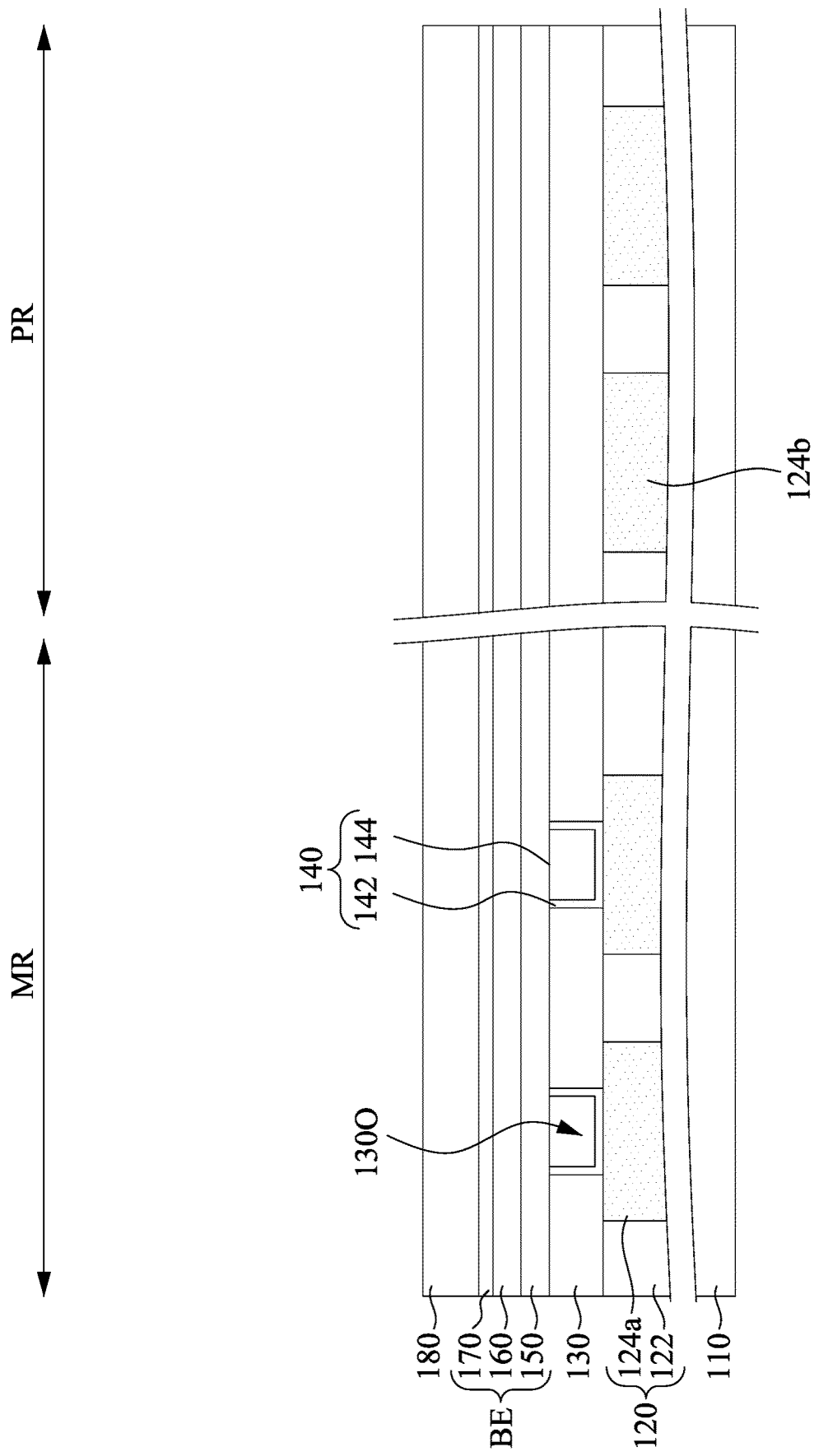

Reference is made to FIG. 7. A ferroelectric layer 180 is deposited over the metal-containing compound layer 170. In some embodiments, the ferroelectric layer 180 may include ferroelectric materials, such as hafnium zirconium oxide ($HfZrO_2$, HZO), lead zirconate titanate ($Pb(Zr,Ti)O_3$, PZT), strontium bismuth tantalite ($SrBi_2Ta_2O_9$, SBT), doped hafnium oxide ($Si:HfO_2$), barium titanate ($BaTiO3$, BTO), hafnium oxide ($HfO_2$), and zirconium oxide ($ZrO_2$). In some embodiments, the ferroelectric layer 180 may be hafnium oxide ($HfO_2$) doped with Zr, Si, Y, Al, Gd, La, or Sr. The ferroelectric layer 180 may be formed by atomic layer deposition (ALD), such as thermal ALD, and other suitable techniques. In some embodiments, a thickness of the ferroelectric layer 180 is in a range from about 50 angstroms to about 200 angstroms. If the ferroelectric layer 180 is greater than about 200 angstroms or less than about 50 angstroms, area of the ferro phases that demonstrate its ferroelectric behavior may decrease, such that the ferroelectric layer 180 shows less ferro response.

Figure 8:
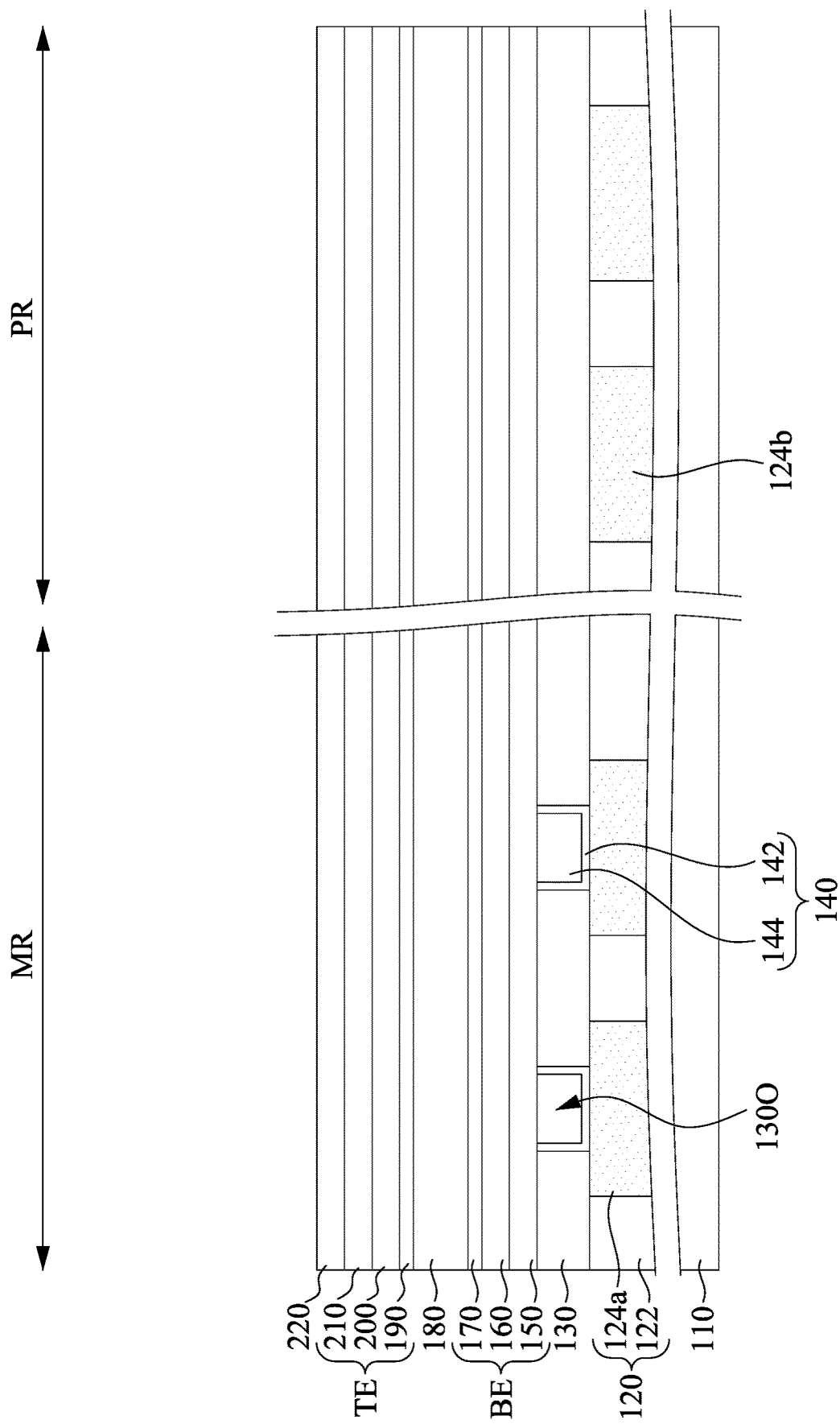

Reference is made to FIG. 8. After the deposition of the ferroelectric layer 180, a top electrode stack layer TE is formed over the ferroelectric layer 180. The top electrode stack layer TE may include a first top electrode layer 200 and a second top electrode layer 210 over the first top electrode layer 200.

In some embodiments, the first top electrode layer 200 may include a conductive material which can act as a suitable barrier to prevent metal diffusion to the ferroelectric layers later formed. For example, the first top electrode layer 200 may include noble metals, such as Ru, Rh, Pd, Os, Ir, Pt, Au, Ag, the like, or the combination thereof. In some embodiments, the first top electrode layer 200 may include platinum-group metals, such as Ru, Rh, Pd, Os, Ir, Pt, the like, or the combination thereof. The first top electrode layer 200 can be a single-layered structure or a multi-layered structure. The first top electrode layer 200 can include a material the same or different from that of the second bottom electrode layer 160. In some embodiments, a thickness of the first top electrode layer 200 may be greater than about 5 nanometers. If the first top electrode layer 200 is less than about 5 nanometers, the first top electrode layer 200 may not well avoid metal diffusion from the second top electrode layer 210 to the ferroelectric layer 180. Formation of the first top electrode layer 200 may be exemplarily performed using CVD, PVD (e.g., sputtering deposition), ALD, the like, and/or a combination thereof.

The second top electrode layer 210 may include one or more suitable conductive materials that does not result in tool contamination during logic fabrication process. For example, the second top electrode layer 210 may include non-platinum group metals or non-noble metals, such as such as tungsten (W), titanium (Ti), tantalum (Ta), aluminum (Al), copper (Cu), TiN, TaN, the like or combinations thereof. The second top electrode layer 210 can be a single-layered structure or a multi-layered structure. Formation of the second top electrode layer 210 may be exemplarily performed using CVD, PVD (e.g., sputtering deposition), ALD, the like, and/or a combination thereof.

In some embodiments, a standard reduction potential of a metal of the first top electrode layer 200 is greater than a standard reduction potential of a metal of the second top electrode layer 210. Through the configuration, the first top electrode layer 200 is more resistant to metal diffusion than the second top electrode layer 210 is, and the first top electrode layer 200 is more resistant to be oxidized than the second top electrode layer 210 is. Furthermore, the metal of the second top electrode layer 210 are selected according to processing tool requirement such that the second top electrode layer 210 covering the first top electrode layer 200 may prevent materials of the first top electrode layer 200 from tool contamination (Pt contamination). For example, in some embodiments, the second top electrode layer 210 includes non-noble metals or non-platinum group metals, and the first top electrode layer 200 includes noble metals or platinum group metals.

In some embodiments, the top electrode stack layer TE may further include a top metal-containing compound layer 190 formed over the surface of the ferroelectric layer 180 prior to the formation of the first top electrode layer 200. The top metal-containing compound layer 190 may include suitable metal oxides, in which the metal of the metal oxides has a standard reduction potential greater than that of the standard reduction potential of the second top electrode layer 210. For example, the top metal-containing compound layer 190 may include platinum-group metal oxides, such as $RuO_x$, $RhO_x$, $PdO_x$, $OsO_x$, $IrO_x$, $PtO_x$. In some embodiments, the materials of the top metal-containing compound layer 190 may be the same as that of the bottom metal-containing compound layer 170. In some alternative embodiments, the materials of the top metal-containing compound layer 190 may be different from that of the bottom metal-containing compound layer 170.

In some embodiments, the top metal-containing compound layer 190 may include a metal element different from that of the first top electrode layer 200. For example, the top metal-containing compound layer 190 includes $RhO_x$, and the first top electrode layer 200 includes Ru. For example, the first top electrode layer 200 includes Rh, and the top metal-containing compound layer 190 includes $RuO_x$. Alternatively, in some other embodiments, the top metal-containing compound layer 190 may include the same metal element as that of the first top electrode layer 200. For example, the top metal-containing compound layer 190 includes $RuO_x$, and the first top electrode layer 200 includes Ru. For example, the top metal-containing compound layer 190 includes $RhO_x$, and the first top electrode layer 200 includes Rh.

In some embodiments, formation of the top metal-containing compound layer 190 may include suitable deposition process, such as PVD, ALD, or the combination thereof. For example, suitable metal may be deposited over the ferroelectric layer 180, and then an oxide treatment is performed to oxidize the metal into the top metal-containing compound layer 190. The oxide treatment may include a heat annealing process. The heat annealing process may also increase the thickness of the bottom metal-containing compound layer 170. Alternatively, suitable metal-containing compound materials (e.g., metal oxides) may be deposited over the ferroelectric layer 180, thereby forming the top metal-containing compound layer 190.

In some embodiments, a thickness of the top metal-containing compound layer 190 may be in a range from about 0 nanometer to about 5 nanometers. If the top metal-containing compound layer 190 is greater than about 5 nanometers, the electrical resistance of the formed memory cells may unnecessarily increase. In some embodiments, the top metal-containing compound layer 190 may be omitted in some embodiments.

In some embodiments, since the bottom metal-containing compound layer 170 experiences more heat annealing processes than that of the top metal-containing compound layer 190 does, a thickness of the bottom metal-containing compound layer 170 may be greater than that of the top metal-containing compound layer 190. For example, in addition to the annealing process performed for forming the bottom metal-containing compound layer 170, the bottom metal-containing compound layer 170 further experiences the annealing process performed after the deposition of the ferroelectric layer 180 for improving ferro phases, and/or the annealing process performed for forming the top metal-containing compound layer 190.

Afterwards, a hard mask layer 220 may be deposited over the top electrode stack layer TE. In some embodiments, the hard mask layer 220 is formed of a dielectric material. For example, the hard mask layer 220 may be include silicon carbide (SiC), silicon oxynitride (SiON), silicon nitride (SiN), silicon dioxide (SiO$_2$), ashing removable dielectric (ARD), the like, and/or combinations thereof. The hard mask layer 220 may be a single-layer structure or multi-layer structure. The materials of the hard mask layer 220 may be formed by suitable deposition techniques, such as CVD, ALD, PVD, the like, and/or combinations thereof.

In some embodiments, a thickness of the hard mask layer 220 may be in a range from about 50 angstroms to about 400 angstroms. If the hard mask layer 220 is less than about 50 angstroms, the hard mask layer 220 may not serve as a etch mask during the following patterning process (e.g., forming a top via opening) since it may be etched through. If the hard mask layer 220 is greater than about 400 angstroms, a top via formed later connected to a formed memory may be open.

Figure 9:
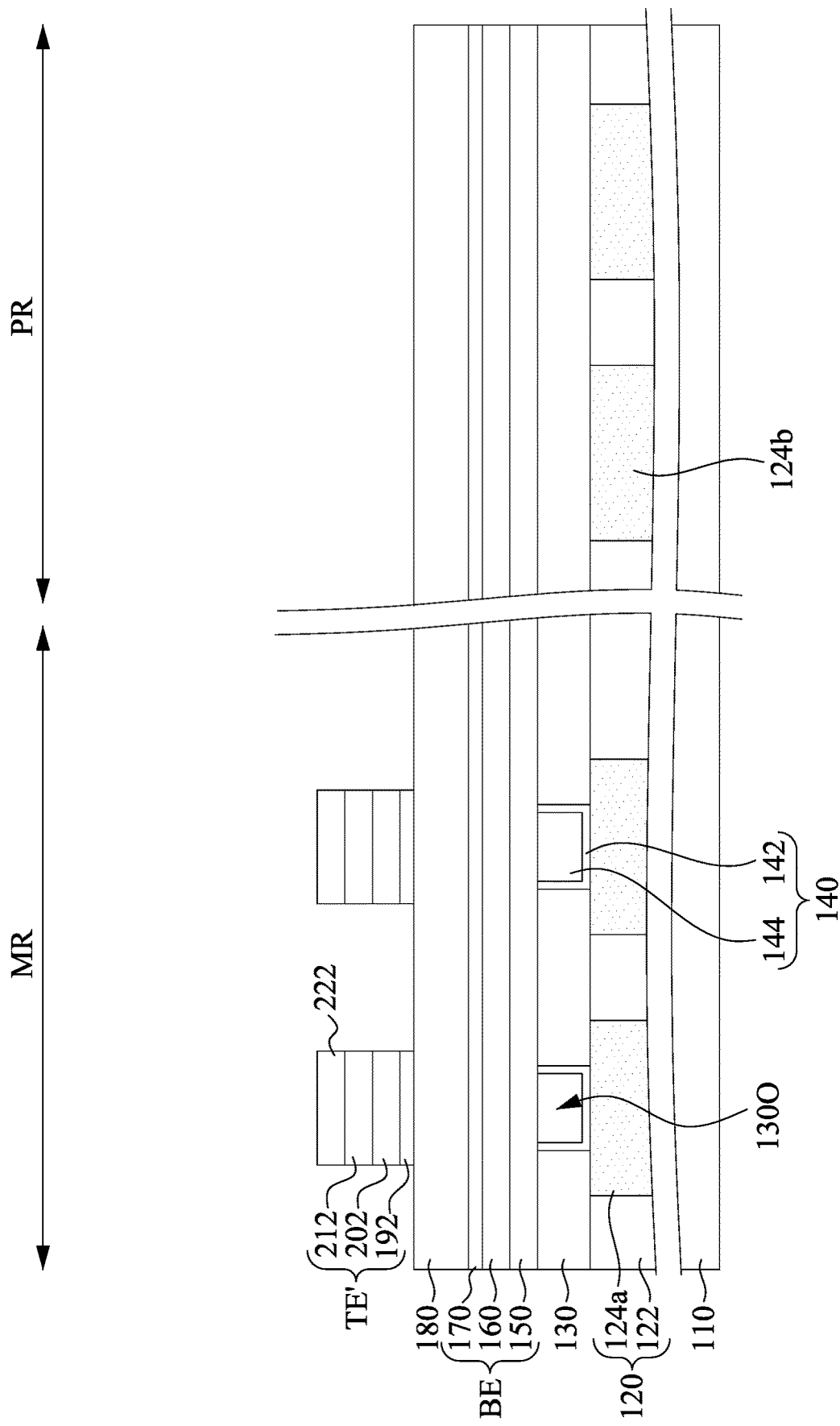

Reference is made to FIG. 9. The hard mask layer 220 and the top electrode stack layer TE (referring to FIG. 8) are respectively patterned into hard masks 222 and top electrodes TE'. In some embodiments, each of the top electrodes TE' may include a top metal-containing compound layer 192 patterned from the top metal-containing compound layer 190, a top electrode 202 patterned from the first top electrode layer 200 (referring to FIG. 8), and a top electrode 212 patterned from the second top electrode layer 210 (referring to FIG. 8).

The patterning process may include a photolithography operation where a photoresist is deposited over the hard mask layer 220 (referring to FIG. 8), a pattern is defined by exposing photoresist to a radiation, and developing the photoresist to create a photoresist pattern. The photoresist pattern is then used as an etch mask to protect desired portions of the hard mask layer 220 (referring to FIG. 8). The hard mask layer 220 (referring to FIG. 8) may then be patterned using an etching operation. In some embodiments, an etchant used to pattern the hard mask layer 220 (referring to FIG. 8) includes an etching chemistry including gases of CF$_4$, CH$_2$F$_2$ and/or other chemicals. The photoresist mask is removed after the patterning. In some embodiments, the photoresist mask can be removed by adding oxygen to the etchant. Subsequently, the hard mask 222 are used as etch masks to pattern the top electrode stack layer TE (referring to FIG. 8). In some embodiments, an etchant is applied to etch an exposed portion of the top electrode stack layer TE (referring to FIG. 8) that is not covered by the hard mask 222. The etching process stops when the ferroelectric layer 180 is reached. In some embodiments, the ferroelectric layer 180 may have a higher etch resistance to the etching process than that of the second top electrode layer 210, the first top electrode layer 200, and/or top metal-containing compound layer 190 (referring to FIG. 8), and act as a etch stop layer during the etching process. In some embodiments, suitable techniques are available to detect the end of etching when a new material layer is reached so as to reduce the amount of over etching.

Figure 10:
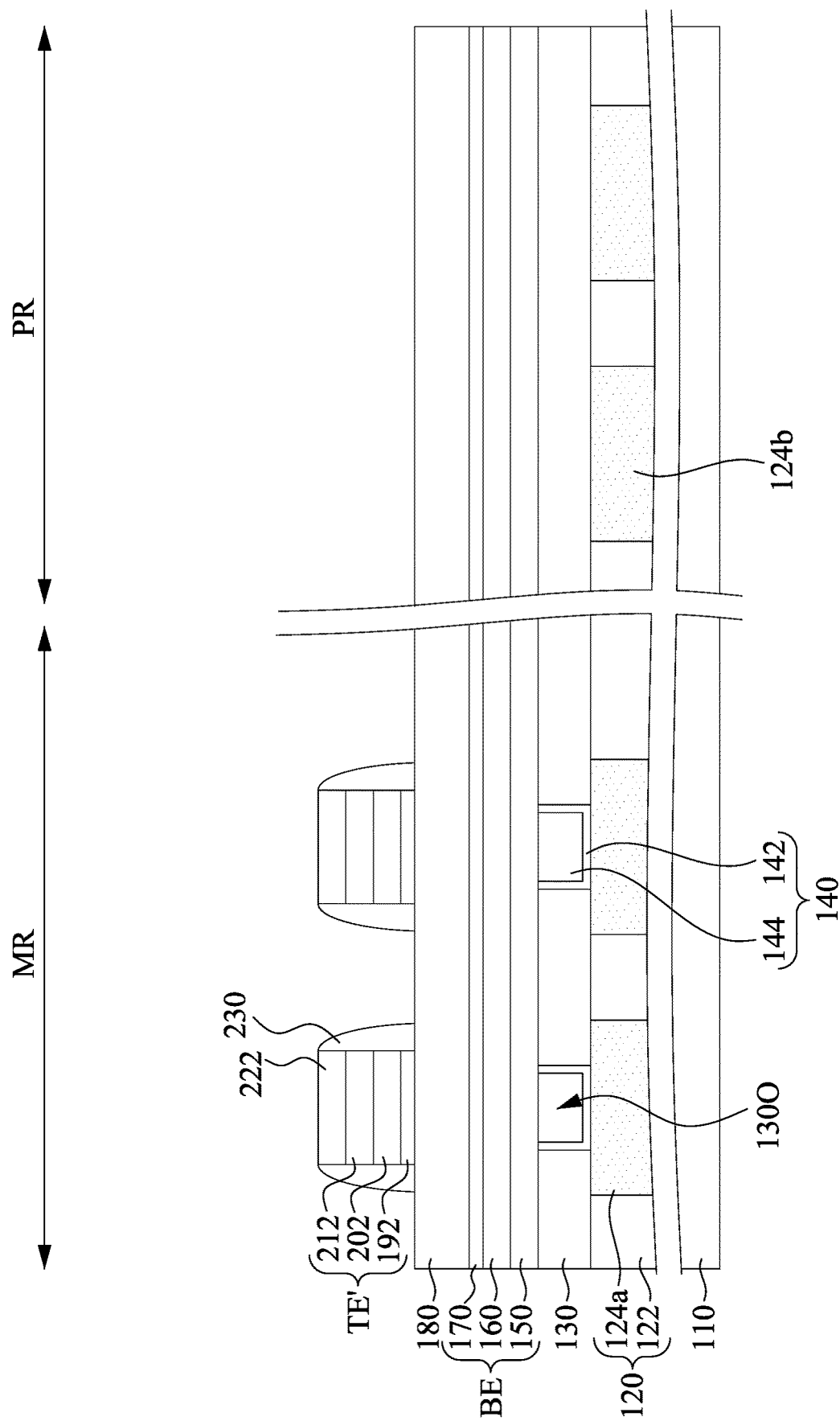

Reference is made to FIG. 10. Spacers 230 are formed around the hard masks 222 and the top electrodes TE'. The spacers 230 may be made of silicon nitride, silicon oxynitride, and silicon oxide. The spacers 230 may be formed by conformally coating a spacer material covering the top and sidewalls of the hard masks 222 and the top electrodes TE' and over the exposed top parts of the ferroelectric layer 180, and then etching the spacer material. Because of the shape of the conformal deposition, the spacer material over the hard masks 222 is removed during this etch, and left the spacers 230. The spacers 230 surround the hard masks 222, the top electrodes 212, the top electrodes 202, and top metal-containing compound layers 192, and thus protects them against subsequent etch operations. The height and width of spacers 230 after etching may be tuned by adjusting deposition and etching parameters.

Figure 11:
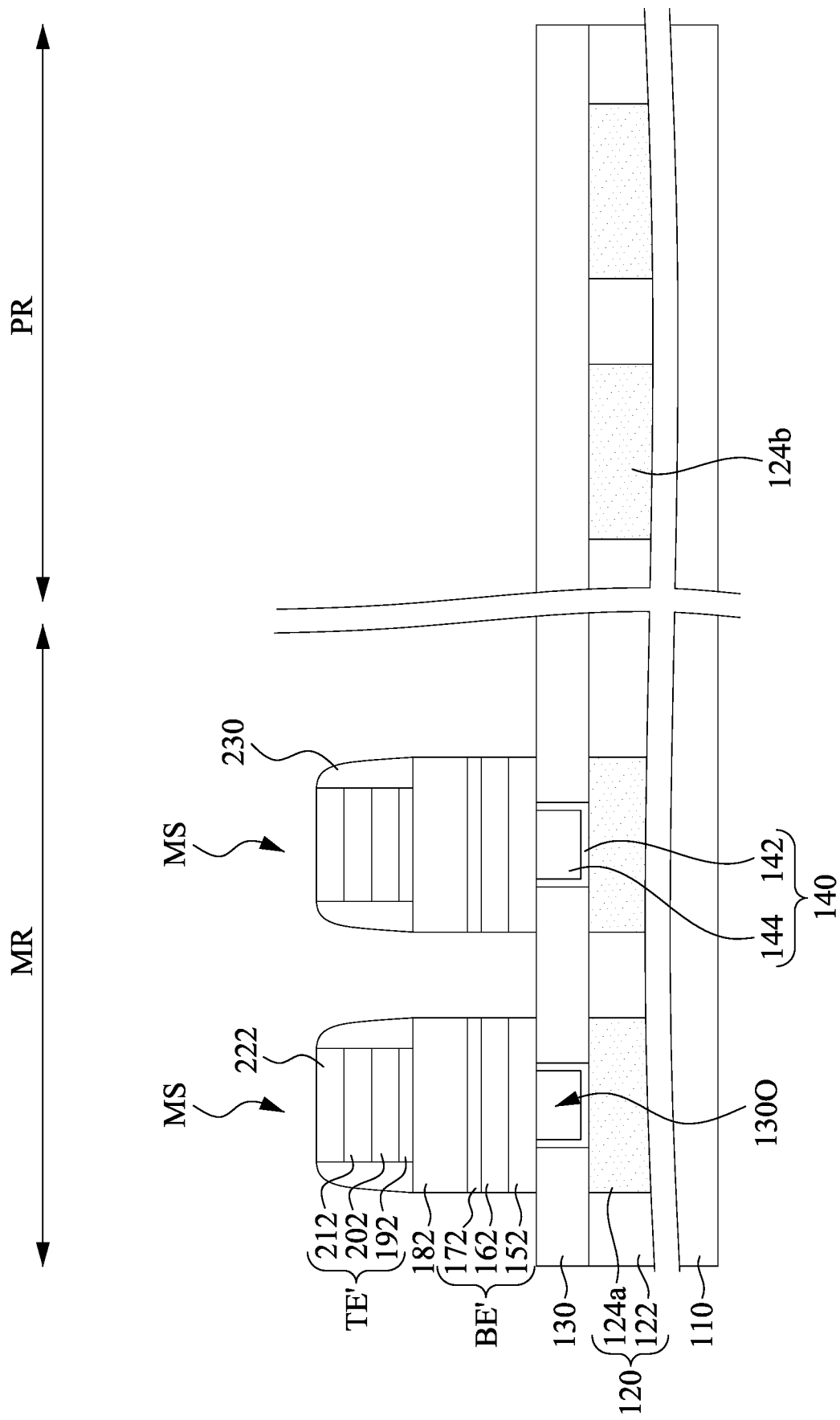

Reference is made to FIG. 11. The ferroelectric layer 180 and the bottom electrode stack layer BE (referring to FIG. 10) are respectively patterned into ferroelectric elements 182 and bottom electrodes BE'. In some embodiments, each of the bottom electrodes BE' may include a bottom metal-containing compound layers 172 patterned from the bottom metal-containing compound layer 170 (referring to FIG. 10), a bottom electrode 162 patterned from the second bottom electrode layer 160 (referring to FIG. 10), and a bottom electrode 152 patterned from the first bottom electrode layer 150 (referring to FIG. 10). The patterning process may include one or plural etching processes, such as dry etch, wet etch, or the combination thereof. The spacers 230 and the hard masks 222 are used as an etch mask to remove portions of the ferroelectric layer 180 and the bottom electrode stack layer BE (referring to FIG. 10) during the etching processes. The etching process stops when the dielectric layer 130 is reached. In some embodiments, the dielectric layer 130 may have a higher etch resistance to the etching process than that of the ferroelectric layer 180 and the bottom electrode stack layer BE (referring to FIG. 10), and act as a etch stop layer during the etching process. In some embodiments, suitable techniques are available to detect the end of etching when a new material layer is reached so as to reduce the amount of over etching.

Through the steps, the memory structures MS are formed, and each of the memory structures MS includes the bottom electrode 152, the bottom electrode 162, the bottom metal-containing compound layer 172, the ferroelectric element 182, the top metal-containing compound layer 192, the top electrodes 202, the top electrode 212, the hard mask 222, and the spacers 230. In some embodiments, the bottom electrode 152 is over the conductive feature 124a, and the bottom electrode 162 may be spaced apart from the conductive feature 124a by the bottom electrode 152.

Figure 12:
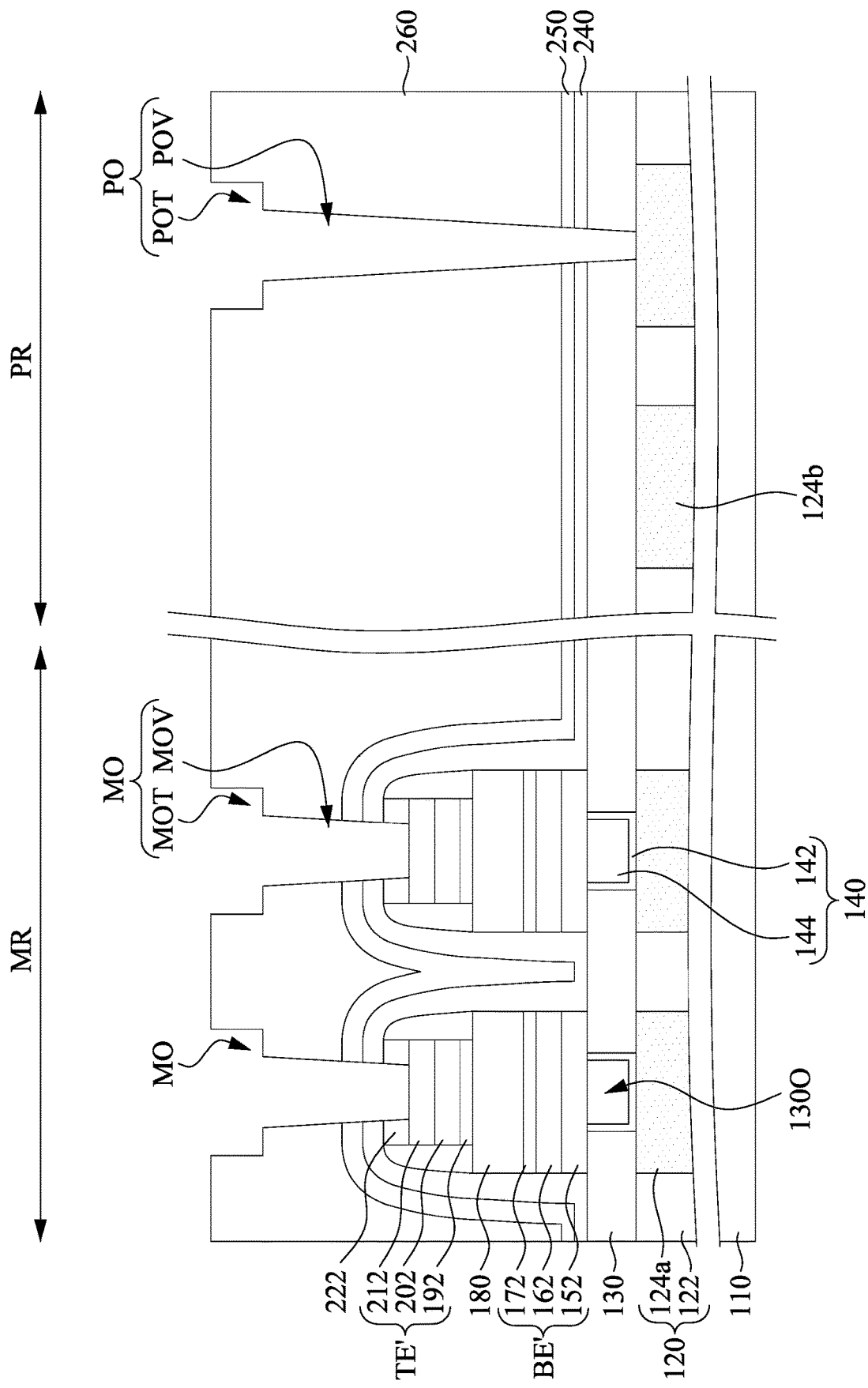

Reference is made to FIG. 12. A protective layer 240, a dielectric layer 250, and an ILD layer 260 are deposited over the memory structures MS, and then top electrode openings MO and an interconnect opening PO are formed in the ILD layer 260, the dielectric layer 250, and the protective layer 240.

The protective layer 240 may include silicon carbide, silicon oxynitride, silicon nitride, carbon doped silicon nitride or carbon doped silicon oxide. The protective layer 240 may include the same material as the dielectric layer 130 does. The protective layer 240 is selected to have a different etch selectivity than overlying dielectric layer material formed in later processes. The protective layer 240 is deposited conformally over the memory structures MS using a chemical vapor deposition (CVD) process such as plasma enhanced (PE) CVD, high-density plasma (HDP) CVD, inductively-coupled-plasma (ICP) CVD, or thermal CVD. In some embodiments, a thickness of the protective layer 240 is in a range from about 50 angstroms to about 300 angstroms. If the protective layer 240 is less than about 50 angstroms, the protective layer 240 may not serve as a etch stop layer during the following etching process. If the protective layer 240 is greater than about 300 angstroms, the fabrication process of the memory cell may not be compatible with logic process.

In some embodiments, the dielectric layer 250 is then conformally deposited over the protective layer 240. The dielectric layer 250 may be made of tetra-ethyl-ortho-silicate (TEOS) or other suitable dielectric materials, as examples. The dielectric layer 250 may be deposited using a CVD, plasma enhanced CVD (PECVD), PVD, or other suitable technique. In some embodiments, a thickness of the dielectric layer 250 is in a range from about 50 angstroms to about 300 angstroms. If the dielectric layer 250 is out of this range, the fabrication process of the memory cell may not be compatible with logic process.

In some embodiments, the ILD layer 260 is deposited over the dielectric layer 250 using suitable deposition techniques. The ILD layer 260 may be silicon oxide, extreme or extra low-k silicon oxide such as a porous silicon oxide layer. For example, the ILD layer 260 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

In some embodiments, after the deposition of the ILD layer 260, top electrode openings MO and an interconnect opening PO are etched in the ILD layer 260, the dielectric layer 250, and the protective layer 240. In some embodiments, formation of the top electrode opening MO and the interconnect opening PO may include a via etching process, a trench etching process, and a liner removal process. The via etching process may be performed to etch a via opening MOV in the ILD layer 260 and the dielectric layer 250 in the memory region MR and etch a via opening POV in the ILD layer 260 and the dielectric layer 250 in the logic region LR. The trench etching process may be performed to etch a trench opening MOT in the ILD layer 260 in the memory region MR, etch a trench opening POT in the ILD layer 260 in the logic region LR. The via etching process and the trench etching process may include suitable anisotropic etching processes. In some embodiments where the ILD layer 260 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. Sometimes, the trench etching process may deepen the via openings MOV and POV after the via etching process. Alternative, in some other embodiments, the trench etching process may be performed prior to the via etching process. In some embodiments, in the logic region LR, the protective layer 240 and dielectric layer 130 may have a higher etch resistance to the via and trench etching processes than that of the ILD layer 260 and the dielectric layer 250, such that the via and trench etching processes may stop at the protective layer 240 and dielectric layer 130. The protective layer 240 and the dielectric layer 130 may be referred to as an etch stop layer in some embodiments.

After the trench etching process and the via etching process, the liner removal process may be performed to remove a portion of the protective layer 240, the dielectric layer 130, and the hard mask 222 exposed by the via opening MOV and POV, such that the via openings MOV and POV may respectively expose the underlying top electrodes 212 and the conductive feature 124b. The liner removal process may include one or more isotropic etching processes, such as dry etching processes using $CH_2F_2$ and Ar as etching gases. In some embodiments, the underlying top electrodes 212 and the conductive feature 124b may have a higher etch resistance to the liner removal process than that of the protective layer 240, the dielectric layer 130, and the hard mask 222, such that the liner removal process may stop at the top electrodes 212 and the conductive feature 124b and not damage the underlying layers. For example, the top electrode openings MO do not expose the top electrode 202.

Figure 13:
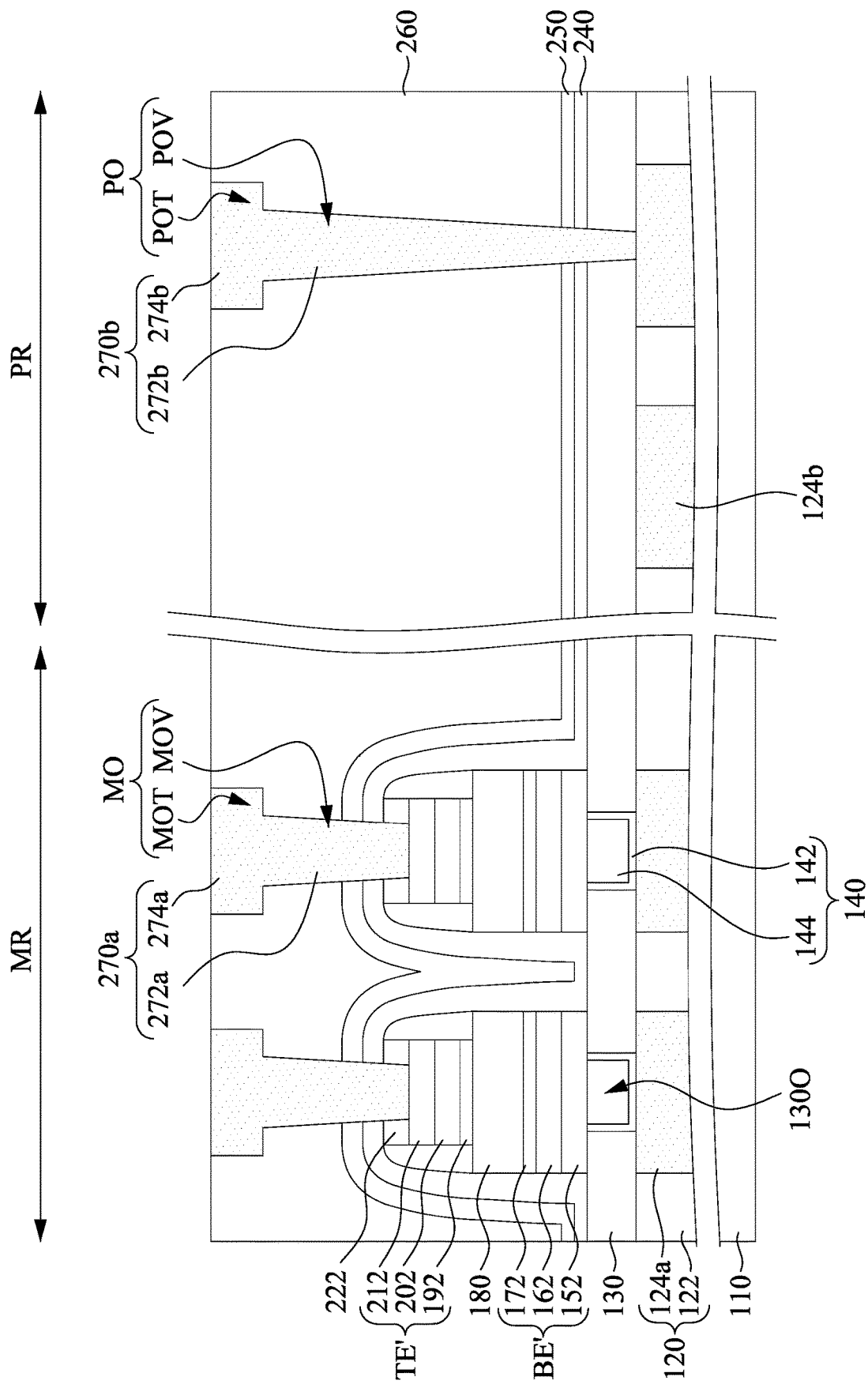

Reference is made to FIG. 13. After the formation of the top electrode openings MO and the interconnect opening PO, the top electrode openings MO and the interconnect opening PO are filled with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode openings MO and the interconnect opening PO. The remaining conductive material may form a metallization pattern 270. The metallization pattern 270 may include the conductive features 270a and 270b in the top electrode opening MO and the interconnect opening PO, respectively. The conductive features 270a may be respectively connected to the memory structures MS, and the conductive features 270b may be connected to the conductive features 124b. As illustrated in the figure, the conductive features 270a may include top electrode via 272a and metal lines 274a, and the conductive features 270b may include conductive via 272b and meta lines 274b. In some embodiments, the conductive features 270a of the metallization pattern 270 are free of contacting with the top electrode 202 and is spaced apart from the top electrode 202 by the top electrode 212.

In some embodiments, a thickness of the top electrodes 212 is greater than that of the top electrodes 202, such that the top electrodes 212 may not be etched through during the formation of the top electrode openings MO, thereby reducing the risk of tool contamination (e.g., Pt contamination). For example, the thickness of the top electrodes 212 is in a range from about 100 angstroms to about 300 angstroms, and the thickness of the top electrodes 202 is in a range from about 50 angstroms to about 150 angstroms. If the top electrodes 212 is less than about 100 angstroms, the top electrodes 212 may be etched through to expose the top electrodes 202 during the formation of the top electrode openings MO, which may result in tool contamination. If the top electrodes 202 is less than about 50 angstroms, the top electrodes 202 may not well avoid the metal diffusion to the ferroelectric element 182. If a sum thickness of the top electrodes 212, the top electrodes 202, or the combination thereof is too large (e.g., greater than about 450 angstroms), the cell height is unnecessarily increased. If a sum thickness of the top electrodes 212 and the top electrodes 202 is too small (e.g., less than about 150 angstroms), a shear resistance of the top electrode TE' may become high. In some embodiments, for achieving appropriate cell height and shear resistance, preventing metal diffusion, and voiding tool contamination, the ratio of a thickness of the top electrodes 212 to that of the top electrodes 202 is in a range from about 1.5 to about 13.

In some cases, oxides in the ferroelectric elements 182 may be taken by adjacent electrodes, which may increase oxide vacancies in the ferroelectric elements 182, and further result in leakage of the Metal/Ferro/Metal (MFM) memory cell. The leakage of the MFM memory cell may result in poor data retention and low breakdown voltage. Furthermore, parts of the electrodes adjacent the ferroelectric elements 182 may be converted into metal oxides by taking the oxides in the ferroelectric elements 182. If the electrodes are highly active, the formed metal oxides may be so thick that the resulted MFM memory cell may have a high parasitic resistance.

In some embodiments of the present disclosure, owing to the inactivity of the noble metals or platinum-group metals, oxides in the ferroelectric elements 182 would not be taken away by metals in the bottom and top electrodes 162 and 202. For example, an oxidation rate of the metal of the bottom electrode 162 (e.g., noble metal) is less than an oxidation rate of the metal of the bottom electrode 152 (e.g., non-noble metal), and an oxidation rate of the metal of the top electrode 202 (e.g., noble metal) is less than an oxidation rate of the metal of the top electrode 212 (e.g., non-noble metal). That is, standard reduction potentials of the metal of the electrodes 162 and 202 (e.g., noble metal) are greater than standard reduction potentials of the metal of the electrodes 152 and 212 (e.g., non-noble metal). Through the configuration, the number of oxide vacancies in the ferroelectric elements 182 are prevented from getting increased, thereby reducing leakage of the MFM memory cell, which in turn may achieve better data retention and high breakdown voltage.

Standard reduction potential, also referred to as a standard electrode potential, is used as one indicator of oxidizability. The greater the negativeness of a standard reduction potential the greater the tendency of the element to oxidize. In some embodiments, the standard reduction potential is measured under standard conditions: 25° C., a 1 activity for each ion participating in the reaction, a partial pressure of 1 bar for each gas that is part of the reaction, and metals in their pure state. In some embodiments, the standard reduction potential can be defined relative to a standard hydrogen electrode (SHE) reference electrode, which is arbitrarily given a potential of 0.00 V. For example, noble (non-reactive) metals) have positive value of the standard reduction potential. Through the configuration, the metals of the bottom and top electrodes 162 and 202 have positive value of the standard reduction potential, while the metals of the bottom and top electrodes 152 and 212 have negative value of the standard reduction potential or a positive value of the standard reduction potential less than that the metals of the bottom and top electrodes 162 and 202. For example, noble metals have positive value of the standard reduction potential, while Ti and Ta have negative values of the standard reduction potential.

In some embodiments, the metal-containing compound layers 172 and/or 192 may include a metal having a standard reduction potential greater than that of a standard reduction potential of the electrodes 152 and/or 212. For example, the metal-containing compound layers 172 and/or 192 may include a noble metal, while the electrodes 152 and/or 212 may include a non-noble metal. Since the noble metal oxides or platinum-group metal oxides are more inactive to oxide than the noble metals or platinum-group metals are, the configuration of the bottom and top metal-containing compound layers 172 and 192 is believed to be beneficial for further reducing the leakage of the MFM memory cell. In addition, owing to the inactivity of the noble metals or platinum-group metals, the noble metal oxides or platinum-group metal oxides are quite thinned, thereby achieving low parasitic resistance of the MFM memory cell.

Figure 14:
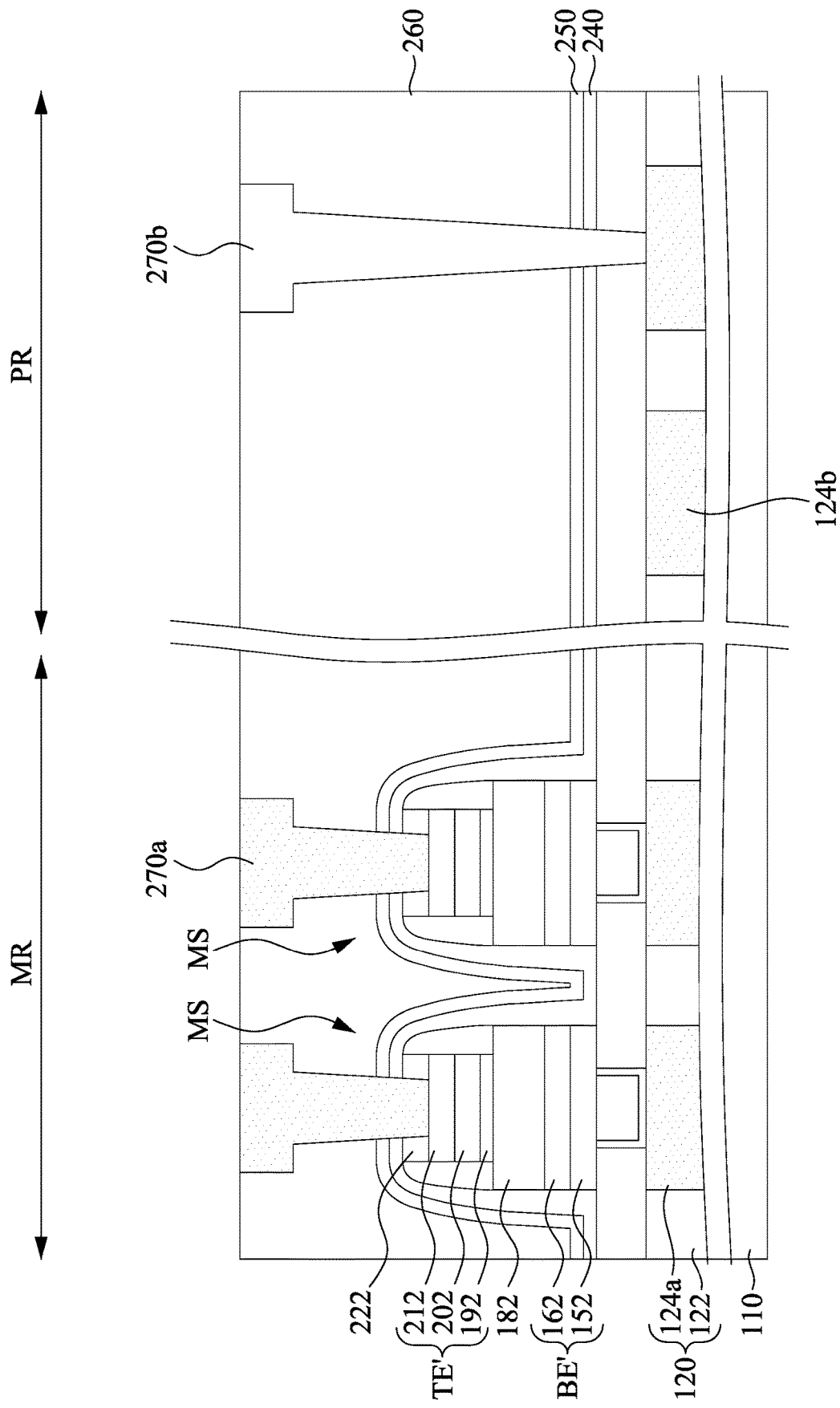
FIG. 14 is a cross-sectional view of an integrated circuit device in accordance with some embodiments of the present disclosure.

FIG. 14 is a cross-sectional view of an integrated circuit device in accordance with some embodiments of the present disclosure. The present embodiments are similar to those illustrated with respect to the embodiments of FIGS. 1-13, except that the bottom electrodes BE' of the memory structures MS are free of the bottom metal-containing compound layers 172 (referring to FIG. 13). In the present embodiments, the ferroelectric layer 180 (referring to FIG. 7) is directly deposited over the second bottom electrode layer 160 (referring to FIG. 7) without the formation of addition layers (e.g., oxide layers, such as the bottom metal-containing compound layer 170 in FIG. 7) therebetween. In other words, a bottom surface of the formed ferroelectric layer 180 (referring to FIG. 7) is in direct contact with the second bottom electrode layer 160 (referring to FIG. 7). In some embodiments, prior to the deposition of the ferroelectric layer 180 (referring to FIG. 7), a cleaning process may be optionally performed to a top surface of the second bottom electrode layer 160 (referring to FIG. 7). The cleaning process may remove oxides from a top surface of the second bottom electrode layer 160 (referring to FIG. 7).

Through the process, within the memory structures MS, a bottom surface of the ferroelectric element 182 is in direct contact with the bottom electrode 162 without a metal-containing compound layer intervening therebetween. Other details of the present embodiments are similar to those illustrated in the embodiments of FIGS. 1-13, and therefore not repeated herein.

Figure 15:
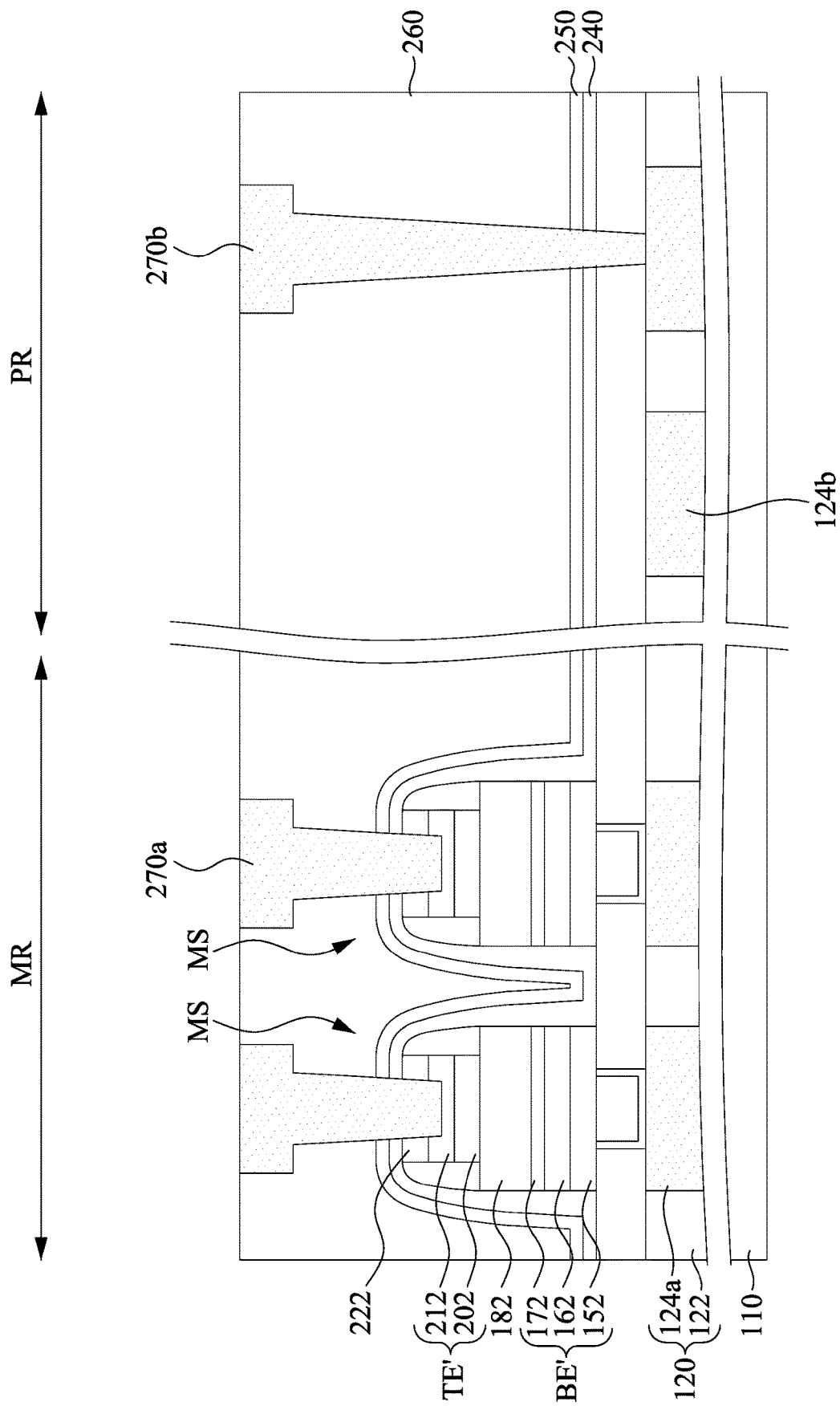
FIG. 15 is a cross-sectional view of an integrated circuit device in accordance with some embodiments of the present disclosure.

FIG. 15 is a cross-sectional view of an integrated circuit device in accordance with some embodiments of the present disclosure. The present embodiments are similar to those illustrated with respect to the embodiments of FIGS. 1-13, except that the top electrodes TE' of the memory structures MS are free of the top metal-containing compound layers 192 (referring to FIG. 13). In the present embodiments, the first top electrode layer 200 (referring to FIG. 7) is directly deposited over the ferroelectric layer 180 without the formation of addition layers (e.g., oxide layers, such as the top metal-containing compound layer 190 in FIG. 7) therebetween. In other words, a top surface of the ferroelectric layer 180 (referring to FIG. 7) is in direct contact with the first top electrode layer 200 (referring to FIG. 7).

Through the process, within the memory structures MS, a top surface of the ferroelectric element 182 is in direct contact with the top electrode 202 without a metal-containing compound layer intervening therebetween. Other details of the present embodiments are similar to those illustrated in the embodiments of FIGS. 1-13, and therefore not repeated herein.

Figure 16:
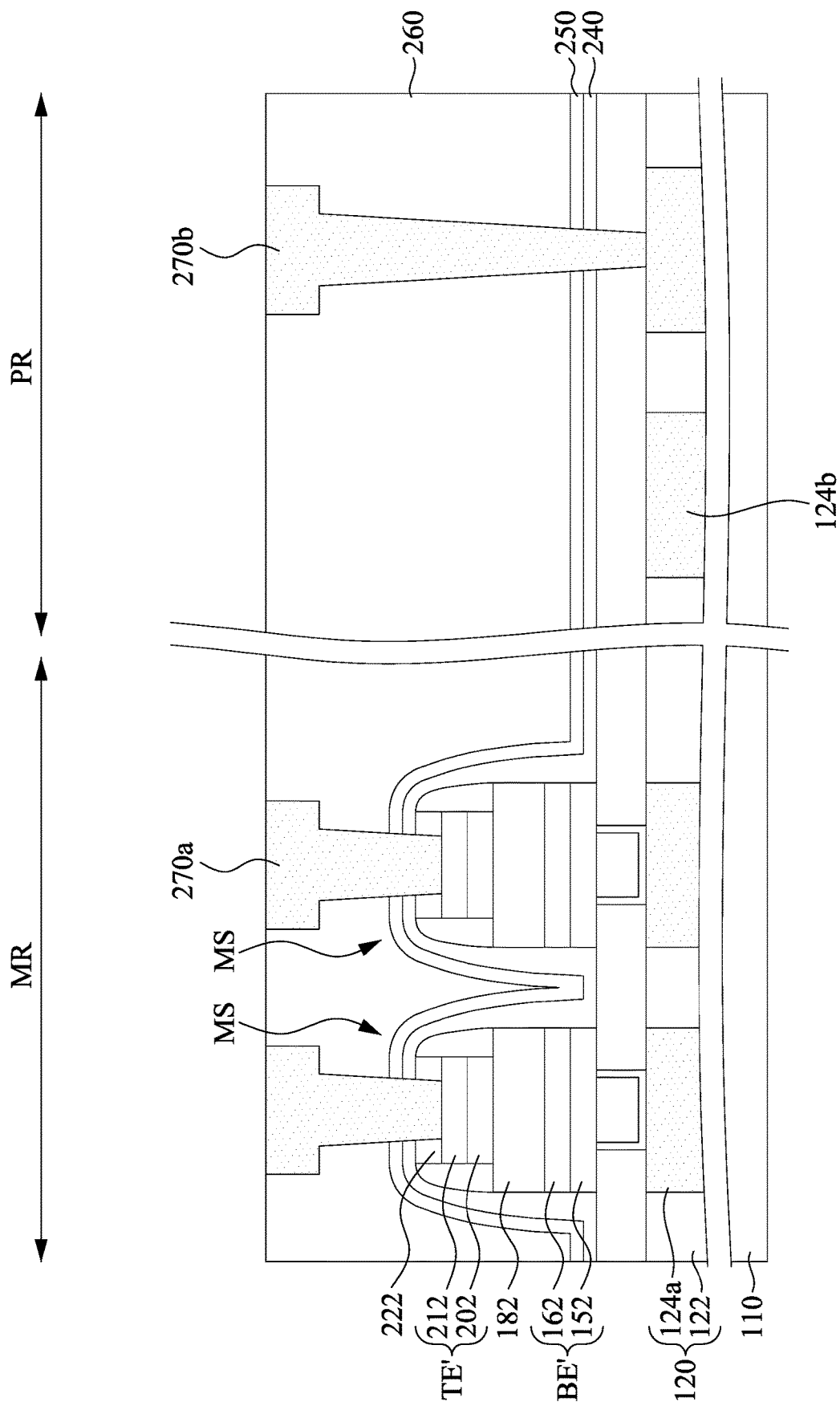
FIG. 16 is a cross-sectional view of an integrated circuit device in accordance with some embodiments of the present disclosure.

FIG. 16 is a cross-sectional view of an integrated circuit device in accordance with some embodiments of the present disclosure. The present embodiments are similar to those illustrated with respect to the embodiments of FIGS. 14-15, except that the bottom electrodes BE' of the memory structures MS are free of the bottom metal-containing compound layers 172 (referring to FIG. 13), and the top electrodes TE' of the memory structures MS are free of the top metal-containing compound layers 192 (referring to FIG. 13). As shown in the figure, within one of the memory structures MS, a bottom surface of the ferroelectric element 182 is in direct contact with the bottom electrode 162 without a metal-containing compound layer intervening therebetween, and a top surface of the ferroelectric element 182 is in direct contact with the top electrode 202 without a metal-containing compound layer intervening therebetween. Other details of the present embodiments are similar to those illustrated in the embodiments of FIGS. 14-15, and therefore not repeated herein.

Figure 17:
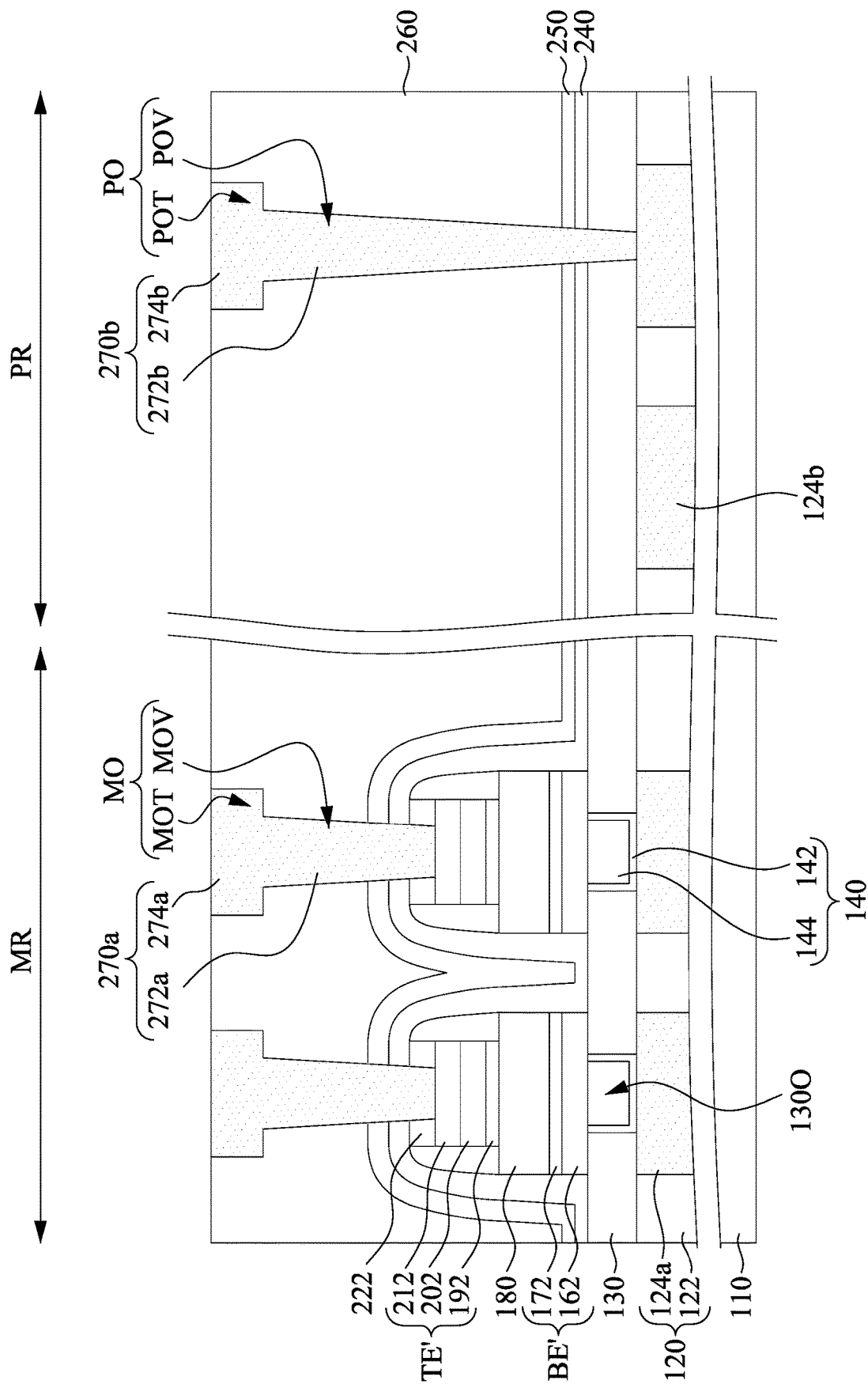
FIG. 17 is a cross-sectional view of an integrated circuit device in accordance with some embodiments of the present disclosure.

FIG. 17 is a cross-sectional view of an integrated circuit device in accordance with some embodiments of the present disclosure. The present embodiments are similar to those illustrated with respect to the embodiments of FIGS. 1-13, except that the memory structure MS may not include the bottom electrodes 152 (referring to FIG. 13) that includes the non-noble metal. In the present embodiments, the second bottom electrode layer 160 (referring to FIG. 6) is directly deposited over the dielectric layer 130 and the BEVAs 140 (referring to FIG. 6) without the formation of addition layers (e.g., the first bottom electrode layer 150 in FIG. 6) therebetween. In other words, a bottom surface of the formed second bottom electrode layer 160 (referring to FIG. 6) is in direct contact with the dielectric layer 130 and the BEVAs 140 (referring to FIG. 6). Through the process, within the memory structures MS, the bottom electrodes 162 that includes the noble metal may be respectively in contact with the BEVAs 140. Through the configuration, a thickness of the bottom electrode BE' is reduced, thereby reducing a height of the memory structure MS. Other details of the present embodiments are similar to those illustrated in the embodiments of FIGS. 1-13, and therefore not repeated herein.

Figure 18:
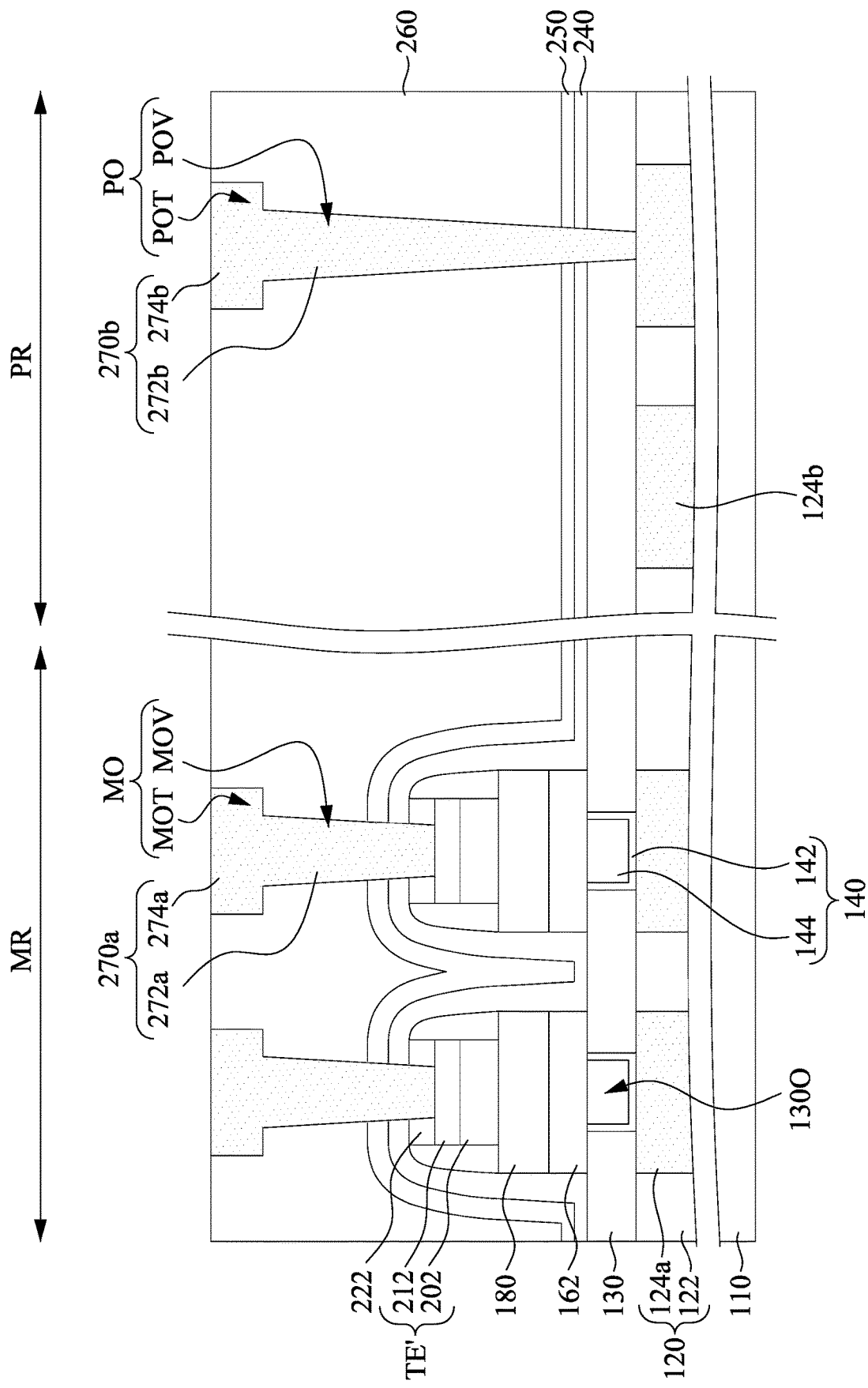
FIG. 18 is a cross-sectional view of an integrated circuit device in accordance with some embodiments of the present disclosure.

FIG. 18 is a cross-sectional view of an integrated circuit device in accordance with some embodiments of the present disclosure. The present embodiments are similar to those illustrated with respect to the embodiments of FIG. 17, except that the memory structure MS are free of the bottom metal-containing compound layer 172 and the top metal-containing compound layer 192 (referring to FIG. 17). As shown in the figure, within the memory structures MS, a bottom surface of the ferroelectric element 182 is in direct contact with the bottom electrode 162 without a metal-containing compound layer intervening therebetween, and a top surface of the ferroelectric element 182 is in direct contact with the top electrode 202 without a metal-containing compound layer intervening therebetween. In some other embodiments, the memory structures MS may include the bottom metal-containing compound layer 172 (referring to FIG. 17), but be free of the top metal-containing compound layer 192 (referring to FIG. 17). Alternatively, the memory structures MS may include the top metal-containing compound layer 192 (referring to FIG. 17), but be free of the bottom metal-containing compound layer 172 (referring to FIG. 17). Other details of the present embodiments are similar to those illustrated in the embodiments of FIG. 17, and therefore not repeated herein.

Figure 19:
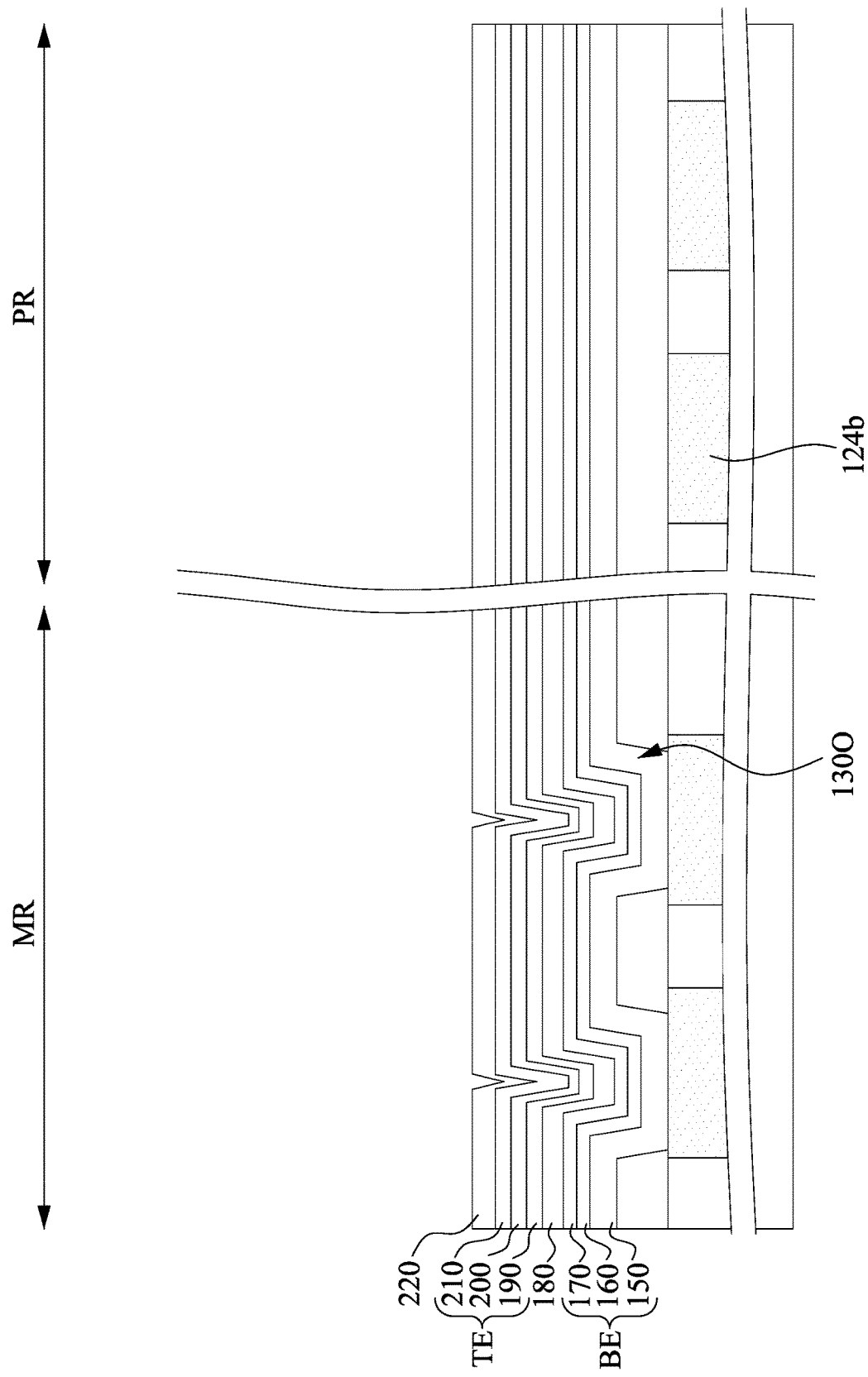
FIGS. 19 through 21 illustrate an integrated circuit device having a memory cell at various stages of fabrication in accordance with some embodiments of the present disclosure.
Figure 20:
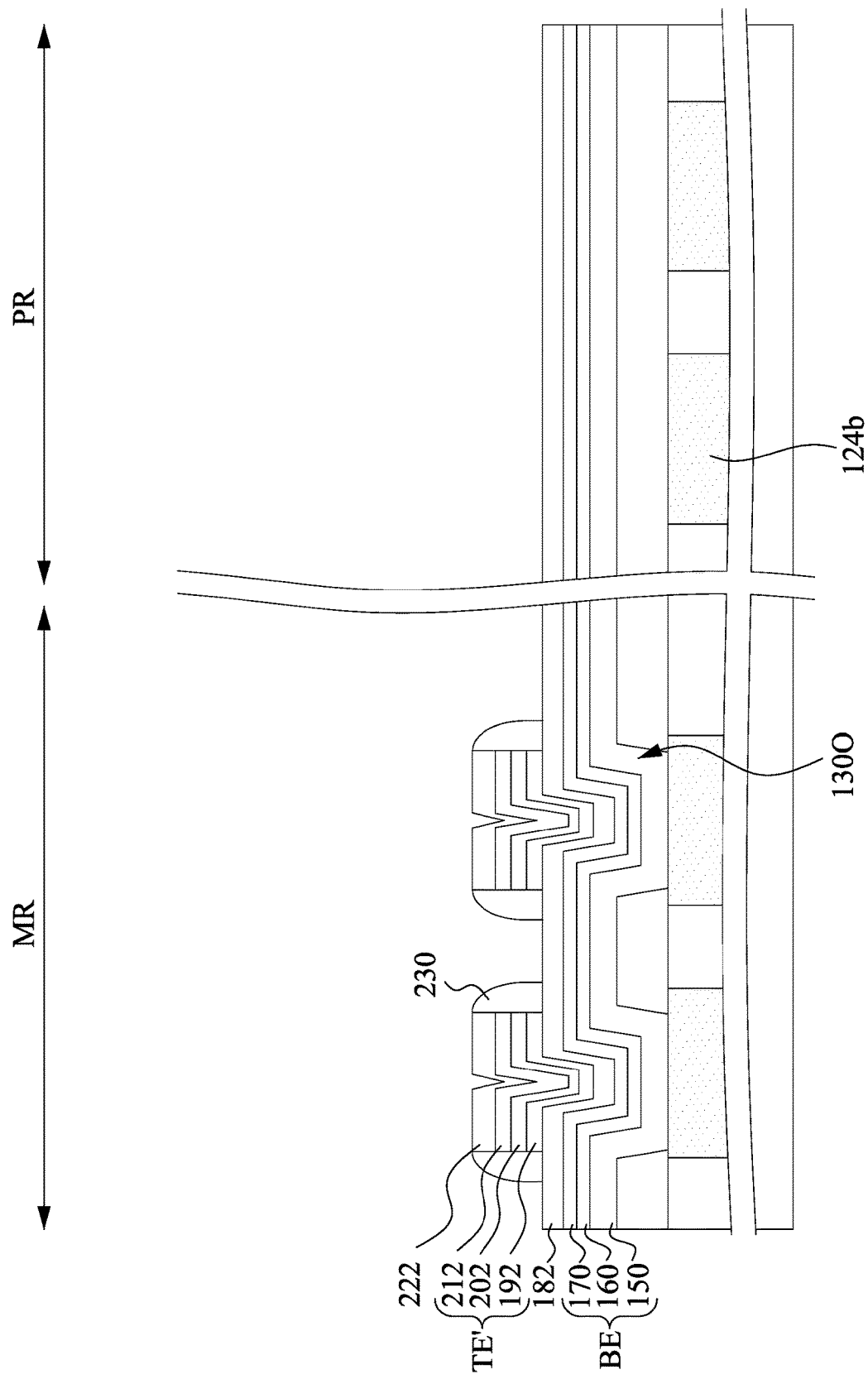
Figure 21:
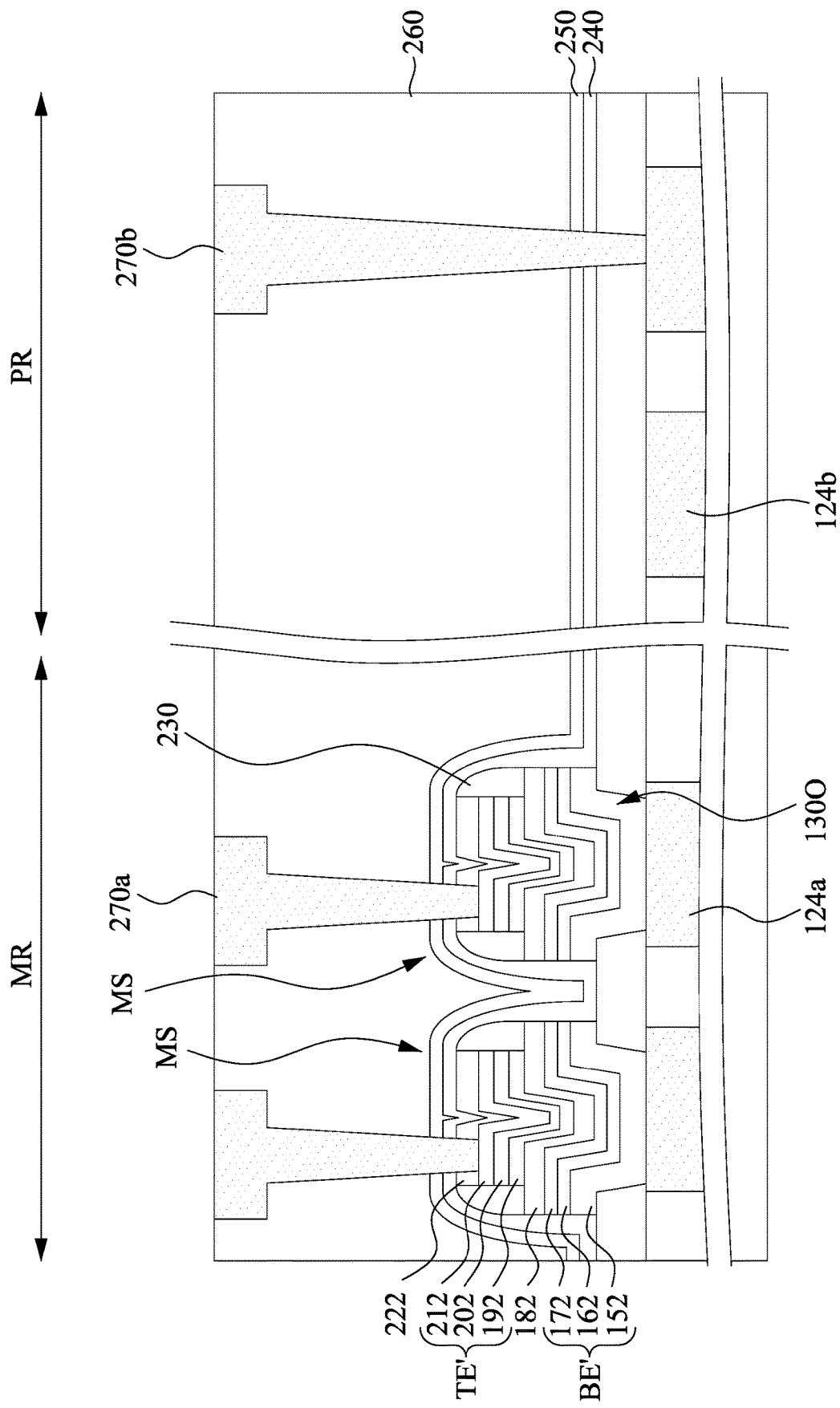

FIGS. 19 through 21 illustrate an integrated circuit device having a memory cell at various stages of fabrication in accordance with some embodiments of the present disclosure. The present embodiments are similar to those illustrated with respect to the embodiments of FIGS. 1-13, except that the BEVA 140 (referring to FIG. 13) may be omitted in the present embodiments.

Referring to FIG. 19, the bottom electrode stack layer BE (e.g., the layers 150-170), the ferroelectric layer 180, the top electrode stack layer TE (e.g., the layers 190-210), and the hard mask layer 220 are depositing in a sequence over the dielectric layer 130 having the openings 130O therein. The deposition processes may result in conformal profile, such that the layers 150-220 may have the profile corresponding to the openings 130O. For example, each of the layers 150-220 has recesses over the openings 130O, and a next layer of the layers 150-220 is deposited into the recesses of a previous layer of the layers 150-220.

Reference is made to FIG. 20. The hard mask layer 220 and the top electrode stack layer TE (referring to FIG. 19) are respectively patterned into hard masks 222 and top electrodes TE'. The patterning process may include a photolithography operation and suitable etching operations. Spacers 230 are formed around the hard masks 222 and the top electrodes TE'. The spacers 230 may be made of silicon nitride, silicon oxynitride, and silicon oxide.

Referring to FIG. 21, the ferroelectric layer 180 and the bottom electrode stack layer BE (referring to FIG. 20) are respectively patterned into ferroelectric elements 182 and bottom electrodes BE'. The patterning process may include one or plural etching processes, such as dry etch, wet etch, or the combination thereof. The spacers 230 and the hard masks 222 are used as an etch mask to remove portions of the ferroelectric layer 180 and the bottom electrode stack layer BE (referring to FIG. 20) during the etching processes.

Through the steps, the memory structures MS are formed, and each of the memory structures MS includes the bottom electrode 152, the bottom electrode 162, the bottom metal-containing compound layer 172, the ferroelectric element 182, the top metal-containing compound layer 192, the top electrodes 202, the top electrode 212, the hard mask 222, and the spacers 230. In the present embodiments, the bottom electrodes 152, the bottom electrodes 162, and the bottom metal-containing compound layer 172 may extend into the openings 130O in the dielectric layer 130 and therefore be connected to conductive features 124a. In some embodiments, the bottom electrodes 152 may have a profile corresponding to the openings 130O, and the bottom electrodes 162 and the bottom metal-containing compound layer 172 overlying the bottom electrodes 152 have the profile correspondingly. In some embodiments, the ferroelectric elements 182, the top metal-containing compound layer 192, the top electrodes 202, the top electrode 212, and the hard masks 222 also have the similar profile correspondingly. Other details of the present embodiments are similar to those illustrated in the embodiments of FIGS. 1-13, and therefore not repeated herein.

Figure 22:
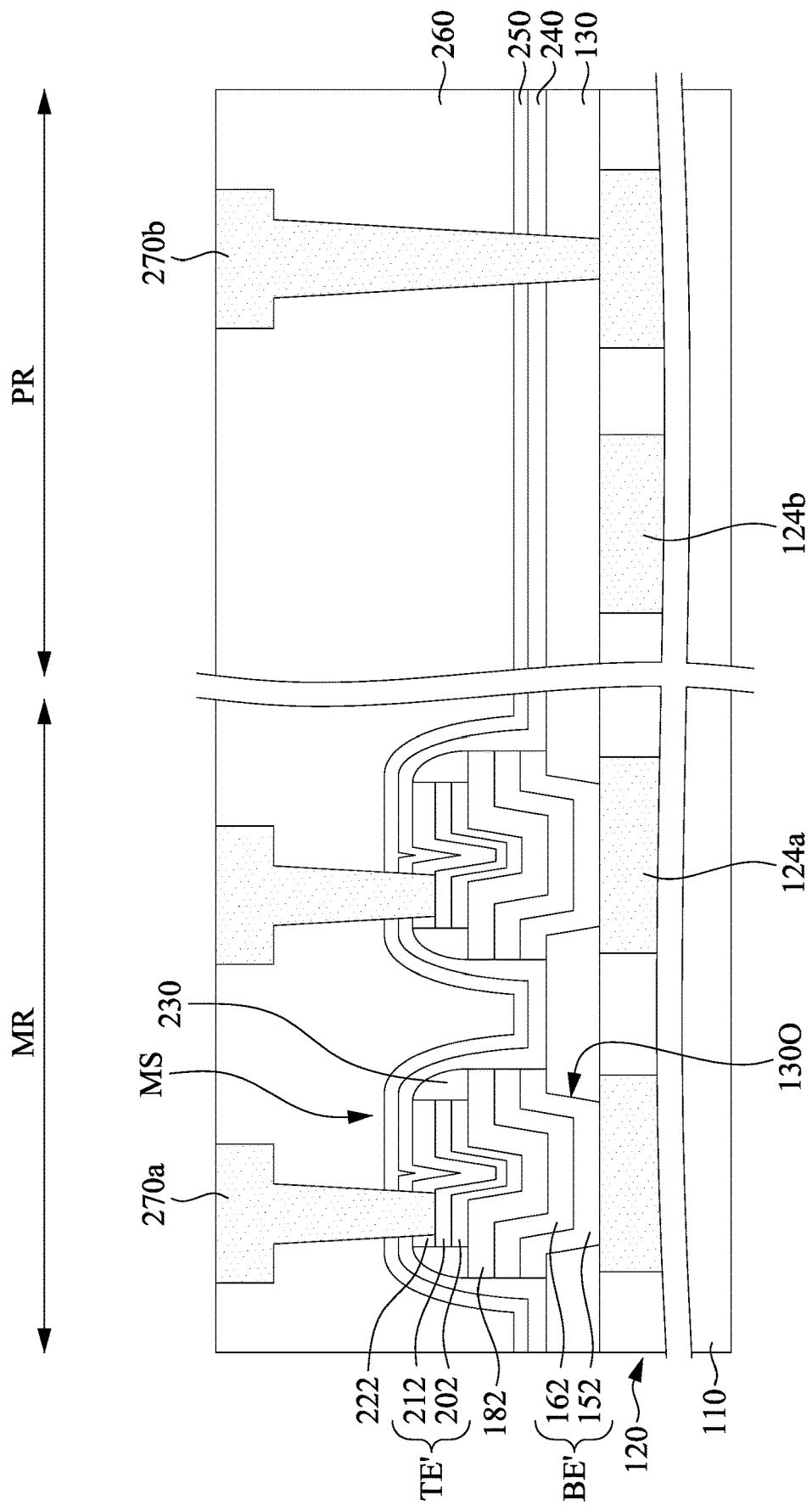
FIG. 22 is a cross-sectional view of an integrated circuit device in accordance with some embodiments of the present disclosure.

FIG. 22 is a cross-sectional view of an integrated circuit device in accordance with some embodiments of the present disclosure. The present embodiments are similar to those illustrated with respect to the embodiments of FIGS. 19-21, except that the memory structures MS are free of the bottom metal-containing compound layer 172 and the top metal-containing compound layer 192 (referring to FIG. 21). As shown in the figure, within the memory structures MS, a bottom surface of the ferroelectric element 182 is in direct contact with the bottom electrode 162 without a metal-containing compound layer intervening therebetween, and a top surface of the ferroelectric element 182 is in direct contact with the top electrode 202 without a metal-containing compound layer intervening therebetween. In some other embodiments, the memory structures MS may include the bottom metal-containing compound layer 172 (referring to FIG. 21), but be free of the top metal-containing compound layer 192 (referring to FIG. 21). Alternatively, the memory structures MS may include the top metal-containing compound layer 192 (referring to FIG. 21), but be free of the bottom metal-containing compound layer 172 (referring to FIG. 21). Other details of the present embodiments are similar to those illustrated in the embodiments of FIGS. 18-20, and therefore not repeated herein.

Figure 23:
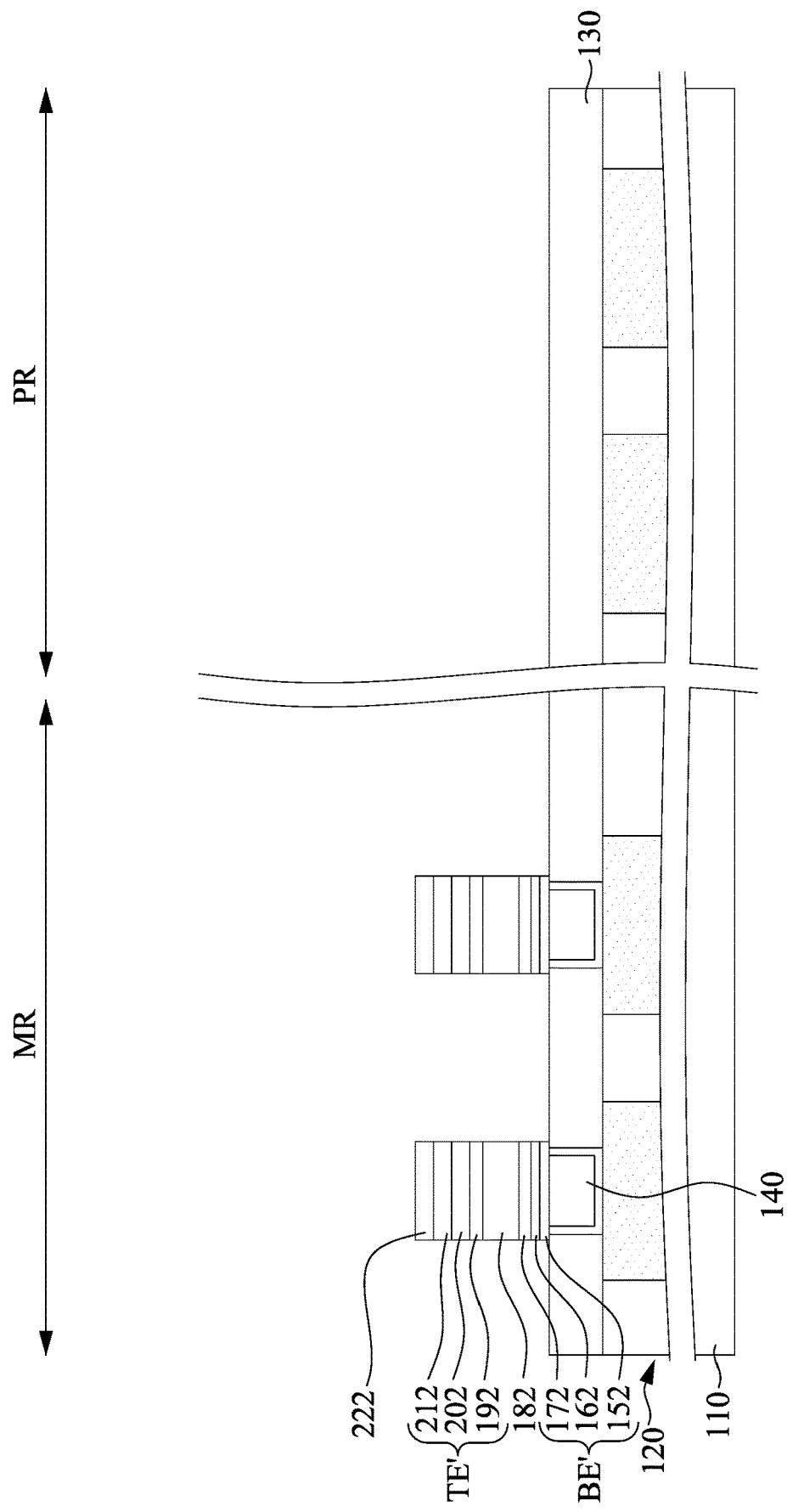
FIGS. 23 through 24 illustrate an integrated circuit device having a memory cell at various stages of fabrication in accordance with some embodiments of the present disclosure.
Figure 24:
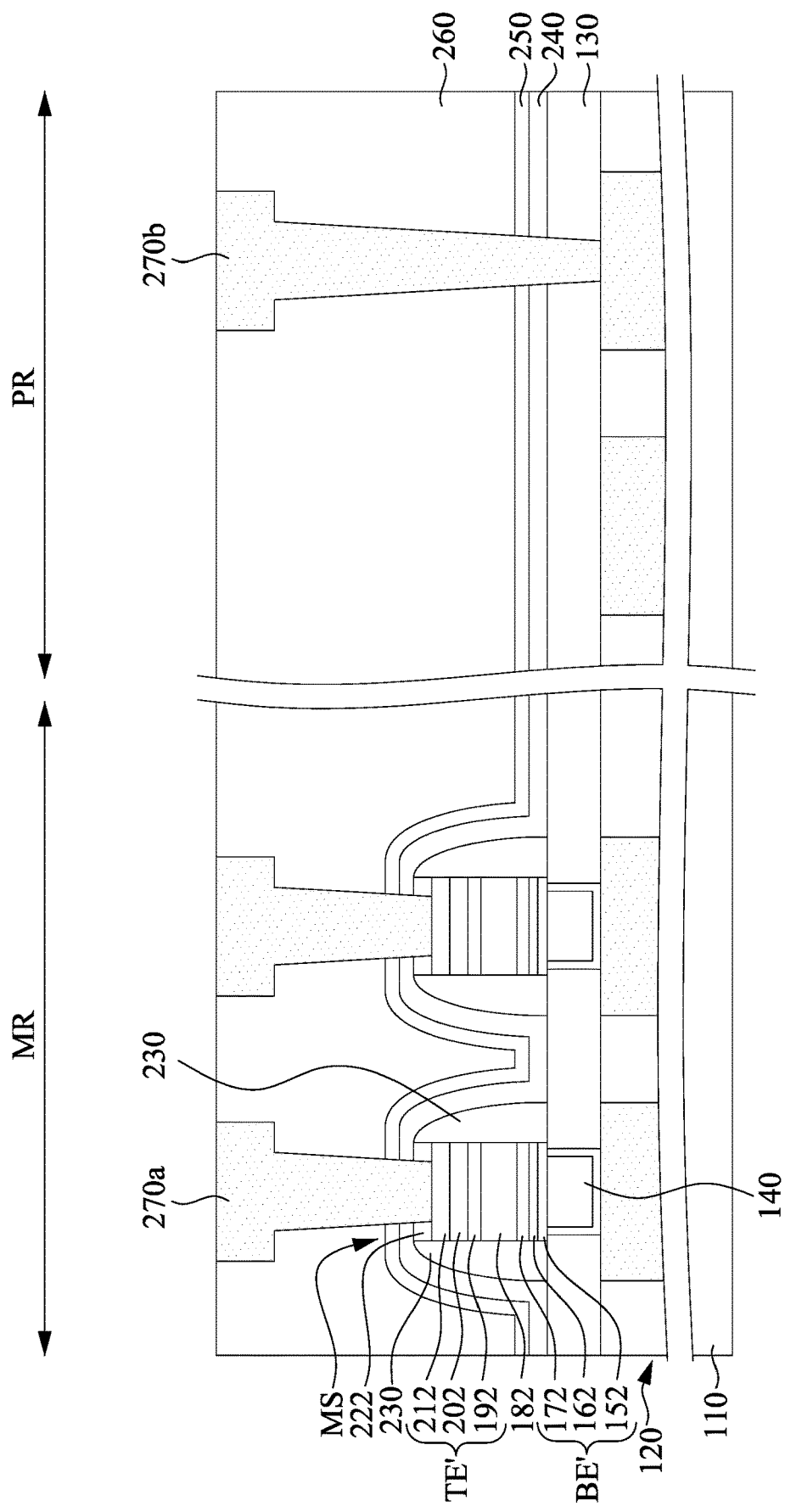

FIGS. 23 through 24 illustrate an integrated circuit device having a memory cell at various stages of fabrication in accordance with some embodiments of the present disclosure. The present embodiments are similar to those illustrated with respect to the embodiments of FIGS. 1-13, except that sidewalls of the hard masks 222, the top electrodes 212, the top electrodes 202, the top metal-containing compound layers 192, the ferroelectric elements 182, the bottom metal-containing compound layers 172, and the bottom electrodes 162 are substantially aligned with each other.

Referring to FIG. 23, the hard mask layer 220 (referring to FIG. 8) is patterned into hard masks 222 by suitable photolithography operation and etching process. Subsequently, the hard mask 222 are used as etch masks to pattern the top electrode stack layer TE, the ferroelectric layer 180, and the bottom electrode stack layer BE (referring to FIG. 8) by suitable etching process. As a result, the layers 150-210 (referring to FIG. 8) are respectively patterned into the top electrodes 212, the top electrodes 202, the top metal-containing compound layers 192, the ferroelectric elements 182, the bottom metal-containing compound layers 172, the bottom electrodes 162, and the bottom electrode 152.

Referring to FIG. 24, spacers 230 are formed around the hard masks 222, the top electrodes 212, the top electrodes 202, the top metal-containing compound layers 192, the ferroelectric elements 182, the bottom metal-containing compound layers 172, the bottom electrodes 162, and the bottom electrode 152. Subsequently, a protective layer 240, a dielectric layer 250, and an ILD layer 260 are deposited over the memory structures MS, and then a metallization pattern 270 including the conductive features 270a and 270b is formed. Other details of the present embodiments are similar to those illustrated in the previous embodiments, and therefore not repeated herein.

Figure 25:
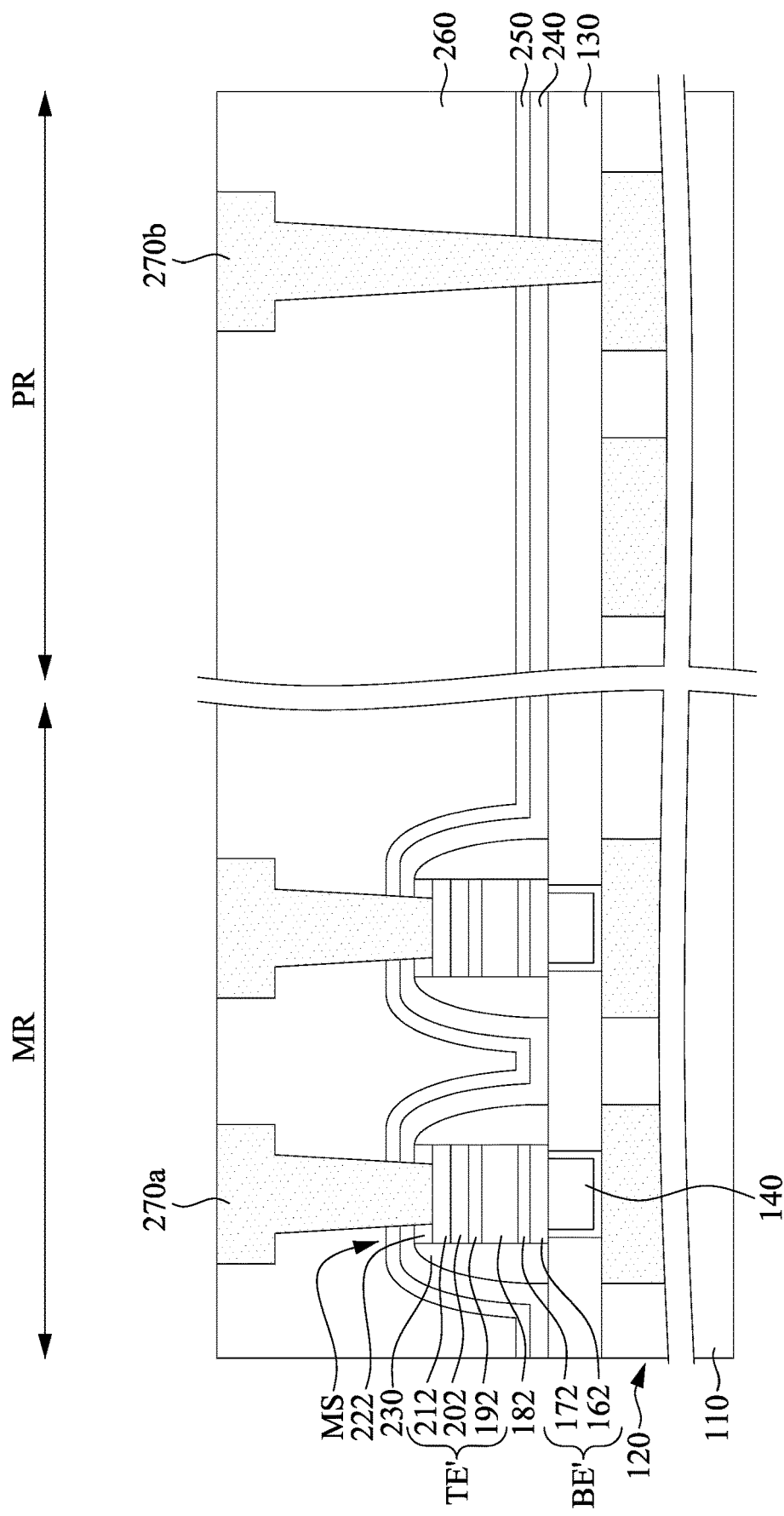
FIG. 25 is a cross-sectional view of an integrated circuit device in accordance with some embodiments of the present disclosure.

FIG. 25 is a cross-sectional view of an integrated circuit device in accordance with some embodiments of the present disclosure. The present embodiments are similar to those illustrated with respect to the embodiments of FIGS. 23-24, except that the memory structure MS may not include the bottom electrodes 152 (referring to FIGS. 23-24) that includes the non-noble metal. In the present embodiments, the bottom electrodes 162 that includes the noble metal are respectively in contact with the BEVAs 140. Through the configuration, a thickness of the bottom electrode BE' is reduced, thereby reducing a height of the memory structure MS. Other details of the present embodiments are similar to those illustrated in the embodiments of FIGS. 23-24, and therefore not repeated herein.

Figure 26:
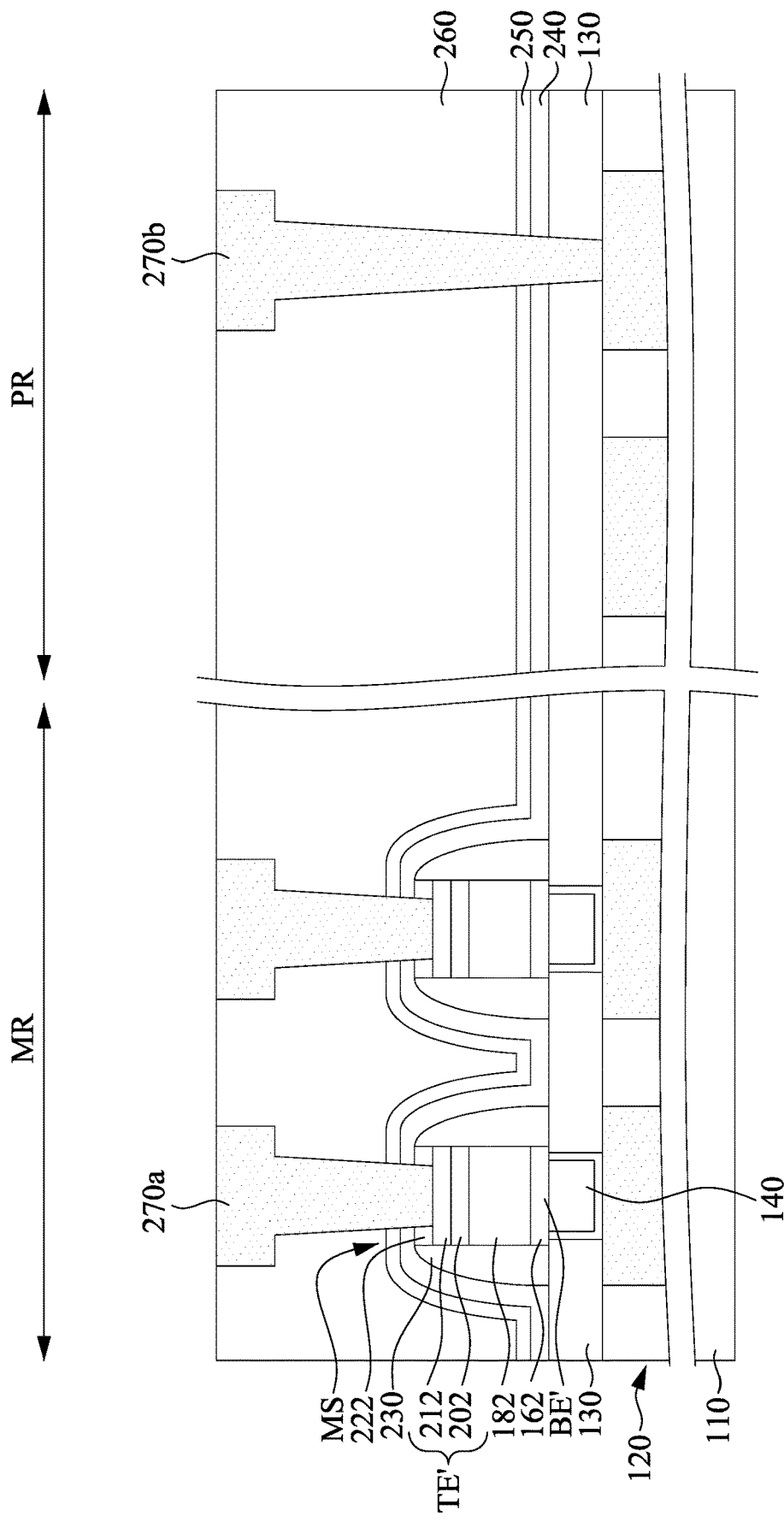
FIG. 26 is a cross-sectional view of an integrated circuit device in accordance with some embodiments of the present disclosure.

FIG. 26 is a cross-sectional view of an integrated circuit device in accordance with some embodiments of the present disclosure. The present embodiments are similar to those illustrated with respect to the embodiments of FIG. 25, except that the memory structures MS are free of the bottom metal-containing compound layer 172 and the top metal-containing compound layer 192 (referring to FIG. 25). As shown in the figure, within the memory structures MS, a bottom surface of the ferroelectric element 182 is in direct contact with the bottom electrode 162 without a metal-containing compound layer intervening therebetween, and a top surface of the ferroelectric element 182 is in direct contact with the top electrode 202 without a metal-containing compound layer intervening therebetween. In some other embodiments, the memory structures MS may include the bottom metal-containing compound layer 172 (referring to FIG. 25), but be free of the top metal-containing compound layer 192 (referring to FIG. 25). Alternatively, the memory structures MS may include the top metal-containing compound layer 192 (referring to FIG. 25), but be free of the bottom metal-containing compound layer 172 (referring to FIG. 25). Other details of the present embodiments are similar to those illustrated in the embodiments of FIG. 25, and therefore not repeated herein.

FIGS. 27 through 31 illustrate an integrated circuit device having a memory cell at various stages of fabrication in accordance with some embodiments of the present disclosure. The present embodiments are similar to those illustrated with respect to the embodiments of FIGS. 1-13, except that the bottom electrode 162 are formed in recesses of the bottom electrodes 152, the bottom metal-containing compound layers 172 are formed in recesses of the bottom electrode 162, the ferroelectric elements 182 are formed in recesses of the bottom metal-containing compound layers 172, the metal-containing compound layers 192 are formed in recesses of the ferroelectric elements 182, the top electrodes 202 are formed in recesses of the metal-containing compound layers 192, and the top electrodes 212 are formed in recesses of the top electrode 202.

Figure 27:
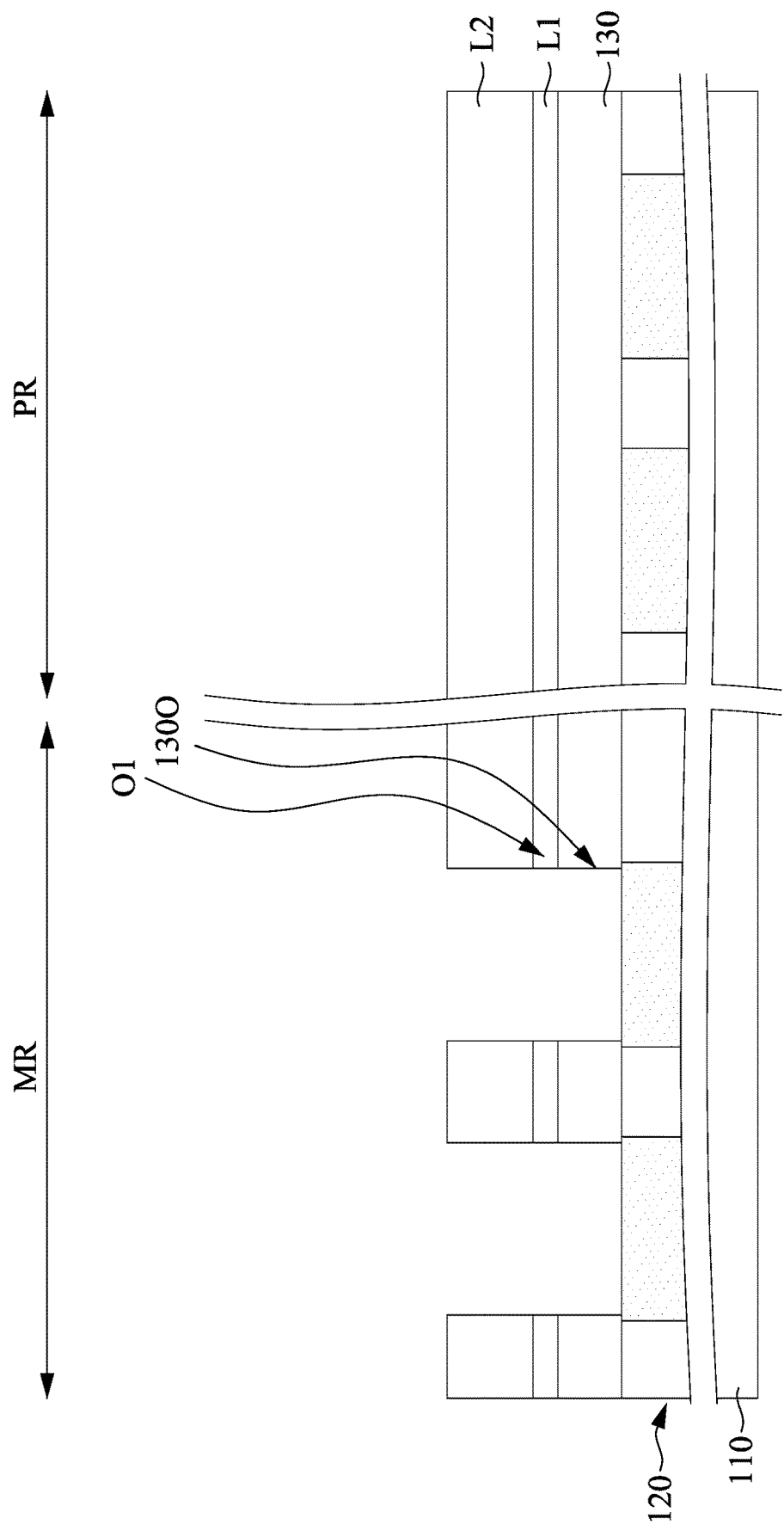
FIGS. 27 through 31 illustrate an integrated circuit device having a memory cell at various stages of fabrication in accordance with some embodiments of the present disclosure.

Reference is made to FIG. 27. A dielectric layer L1 and a dielectric layer L2 are deposited over the dielectric layer 130 after the formation of the dielectric layer 130 as illustrated in FIG. 2. The dielectric layer L1 may be made of tetra-ethyl-ortho-silicate (TEOS) or other suitable dielectric materials, as examples. The dielectric layer L1 may be deposited using a CVD, plasma enhanced CVD (PECVD), PVD, or other suitable technique. The dielectric layer L2 may be silicon oxide, extreme or extra low-k silicon oxide such as a porous silicon oxide layer. For example, the dielectric layer L2 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The dielectric layer L2 may be deposited using a CVD, or other suitable technique. After the formation of the dielectric layers L1 and L2, openings O1 may be etched in the dielectric layers L1 and L2. The dielectric layer 130 may serve as an etch stop layer during etching the openings O1. After the formation of the openings O1, portions of the dielectric layer 130 exposed by the openings O1 are removed by suitable etching process, thereby forming openings 130O in the dielectric layer 130.

Figure 28:
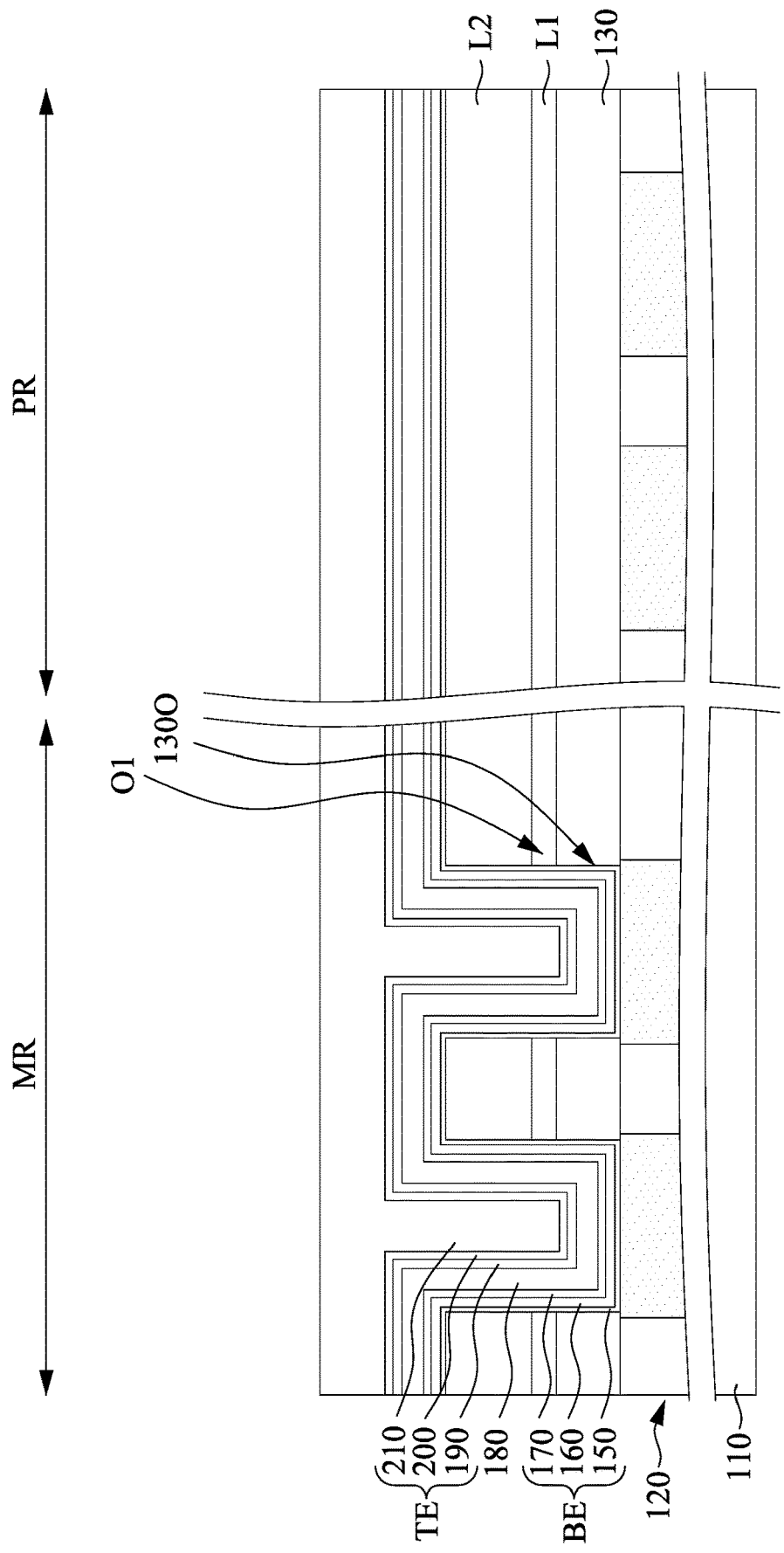

Reference is made to FIG. 28. The bottom electrode stack layer BE (e.g., the layers 150-170), the ferroelectric layer 180, the top electrode stack layer TE (e.g., the layers 190-210) are deposited into the opening O1 in the dielectric layers L1 and L2 and the opening 130O in the dielectric layer 130. In some embodiments, the layer 210 may overfill the opening O1.

Figure 29:
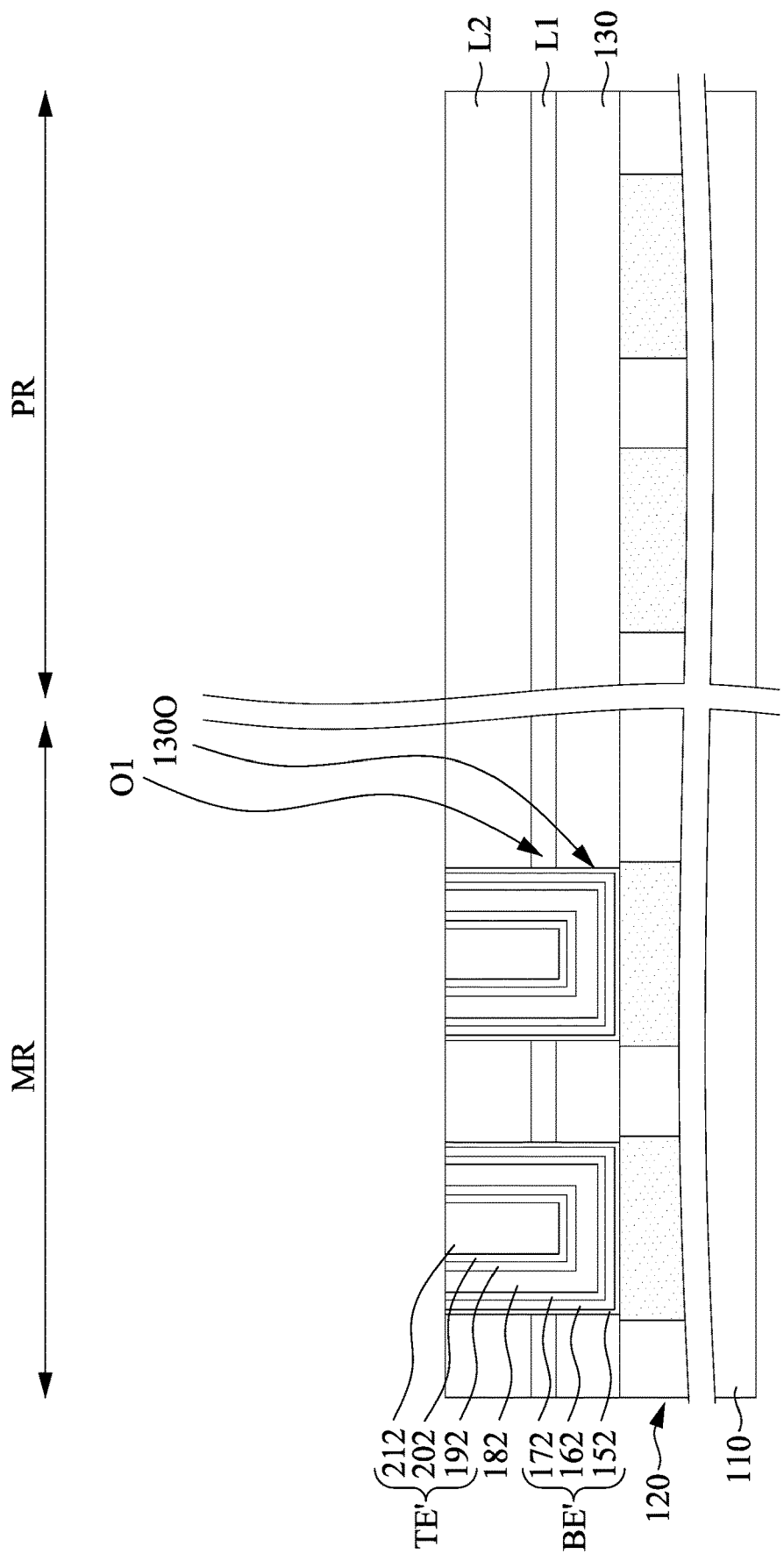

Reference is made to FIG. 29. Portions of bottom electrode stack layer BE (e.g., the layers 150-170), the ferroelectric layer 180, the top electrode stack layer TE (e.g., the layers 190-210) in FIG. 28 out of the openings O1 are removed, thereby forming the memory structure MS. The removal may include a planarization process, such as CMP. Through the processes, a top surface of the memory structure MS may be substantially flat, and the top surface of the memory structure MS may include top surfaces of the top electrodes 212, the top electrodes 202, the top metal-containing compound layers 192, the ferroelectric elements 182, the bottom metal-containing compound layers 172, the bottom electrodes 162, and the bottom electrodes 152.

Figure 30:
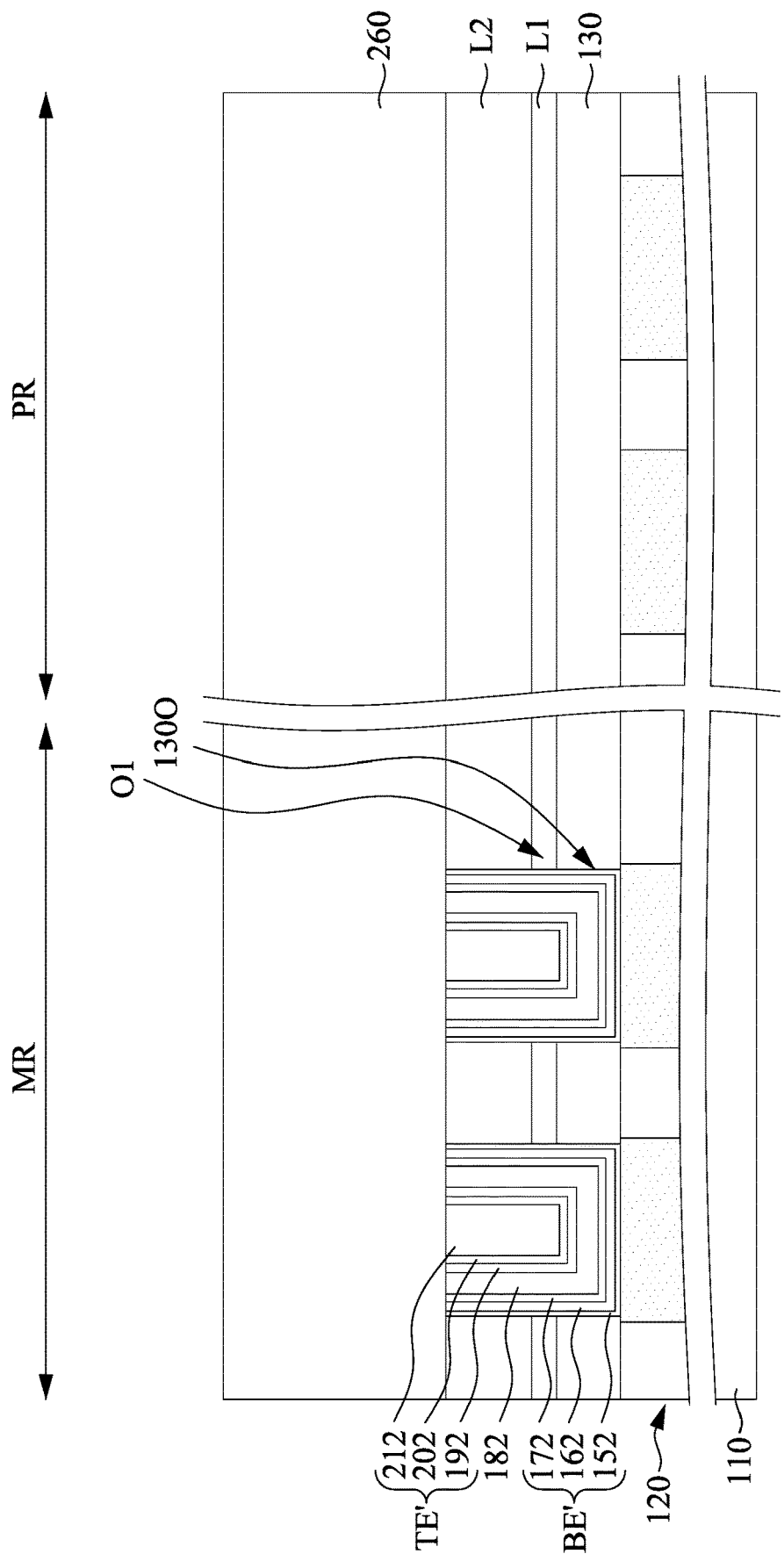

Reference is made to FIG. 30. An ILD layer 260 are deposited over the memory structures MS. The ILD layer 260 may be silicon oxide, extreme or extra low-k silicon oxide such as a porous silicon oxide layer. In some embodiments, the ILD layer 260 may include the same material as that of the dielectric layer L2.

Figure 31:
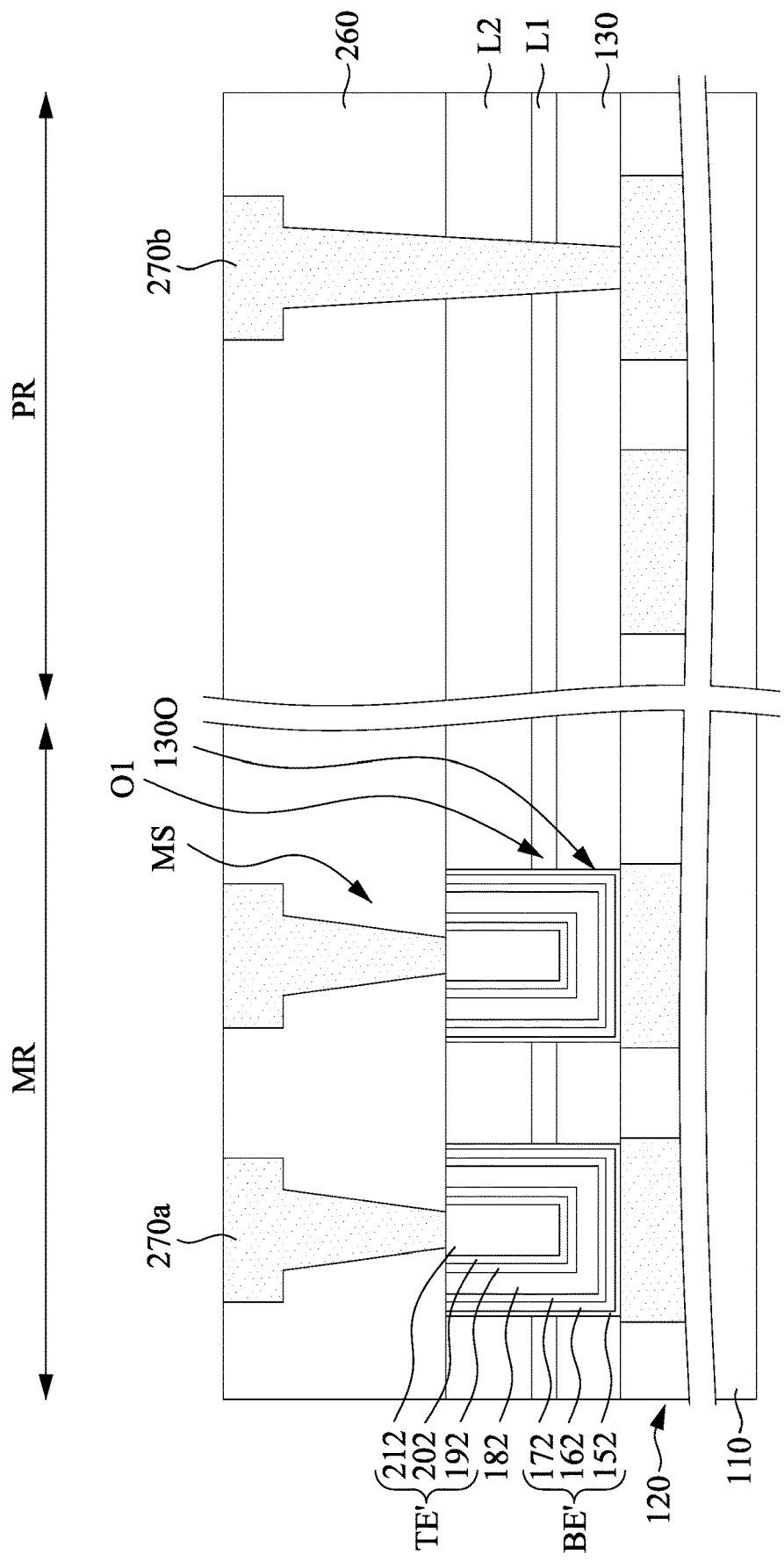

Reference is made to FIG. 31. A metallization pattern 270 including the conductive features 270a and 270b is formed in the ILD layer 260. In the present embodiments, openings are etched in the ILD layer 260 to expose the top electrode 212 and not to expose the ferroelectric elements 182, and then filled with metals, thereby forming the conductive features 270a. In the present embodiments, a bottom width of the conductive features 270a is less than a top width of the top electrode 212, such that the conductive features 270a landing on the top electrode 212 is spaced apart from the ferroelectric elements 182. In some other embodiments, the bottom width of the conductive features 270a may be greater than the top width of the top electrode 212 but less than the top width of the top electrode TE', thereby being spaced apart from the ferroelectric elements 182. Other details of the present embodiments are similar to those illustrated in previous embodiments, and therefore not repeated herein.

Figure 32:
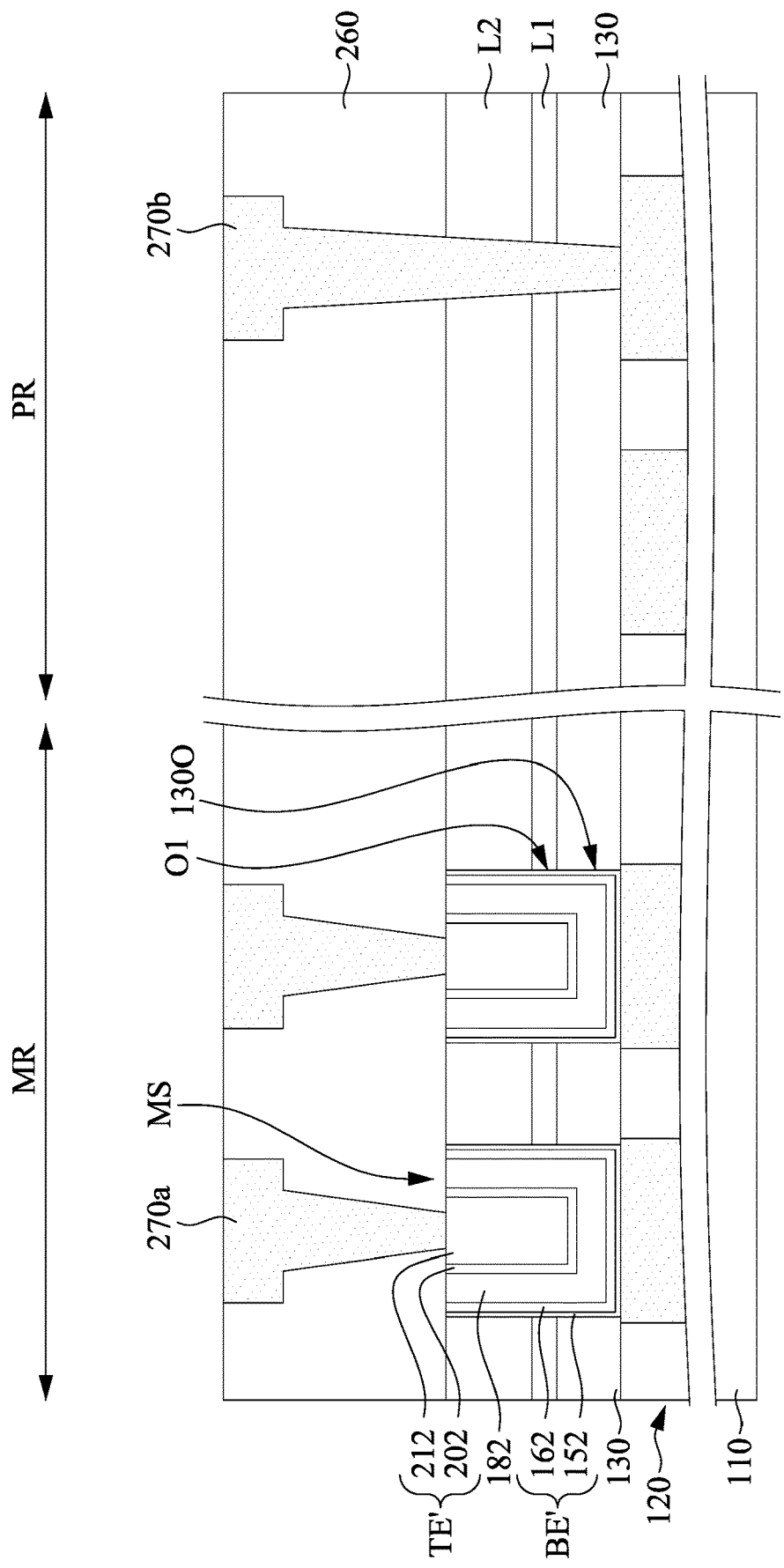
FIG. 32 is a cross-sectional view of an integrated circuit device in accordance with some embodiments of the present disclosure.

FIG. 32 is a cross-sectional view of an integrated circuit device in accordance with some embodiments of the present disclosure. The present embodiments are similar to those illustrated with respect to the embodiments of FIGS. 27-31, except that the memory structures MS are free of the bottom metal-containing compound layer 172 and the top metal-containing compound layer 192 (referring to FIG. 31). As shown in the figure, within the memory structures MS, a bottom surface of the ferroelectric element 182 is in direct contact with the bottom electrode 162 without a metal-containing compound layer intervening therebetween, and a top surface of the ferroelectric element 182 is in direct contact with the top electrode 202 without a metal-containing compound layer intervening therebetween. In some other embodiments, the memory structures MS may include the bottom metal-containing compound layer 172 (referring to FIG. 31), but be free of the top metal-containing compound layer 192 (referring to FIG. 31). Alternatively, the memory structures MS may include the top metal-containing compound layer 192 (referring to FIG. 31), but be free of the bottom metal-containing compound layer 172 (referring to FIG. 31). Other details of the present embodiments are similar to those illustrated in the embodiments of FIGS. 27-31, and therefore not repeated herein.

Figure 33:
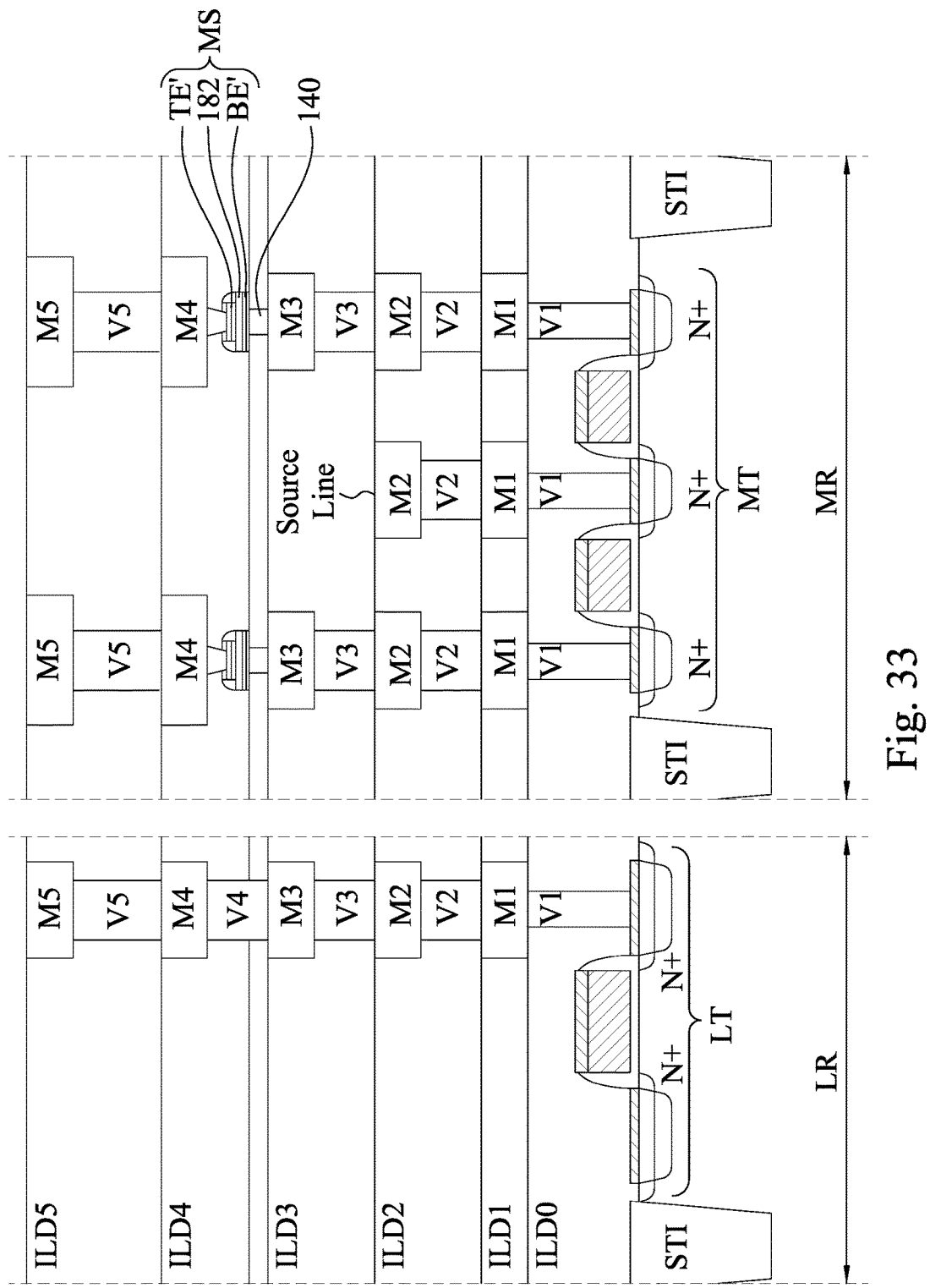
FIG. 33 is a cross-sectional view of an integrated circuit device in accordance with some embodiments of the present disclosure.

FIG. 33 is a cross-sectional view of an integrated circuit device 100 in accordance with some embodiments of the present disclosure. The integrated circuit device 100 is fabricated using five metallization layers, labeled as M1 through M5, with five layers of metallization vias or interconnects, labeled as V1 through V5. Other embodiments may contain more or fewer metallization layers and a corresponding more or fewer number of vias. The logic region LR includes a full metallization stack, including a portion of each of metallization layers M1-M5 connected by interconnects V2-V5, with V1 connecting the stack to a source/drain contact of the logic transistor LT. The memory region MR includes a full metallization stack connecting the memory cells (i.e., the memory structures MS) to transistors MT in the memory region MR, and a partial metallization stack connecting a source line to the transistors MT in the memory region MR. The memory structures MS are depicted as being fabricated in between the M3 layer and the M4 layer. The memory structures MS may include the structure illustrated in the previous embodiments. Also included in integrated circuit is a plurality of ILD layers. Six ILD layers, identified as ILD0 through ILD5 are depicted in FIG. 33 as spanning the logic region LR and the memory region MR. The ILD layers may provide electrical insulation as well as structural support for the various features of the integrated circuit during many fabrication process steps.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that the electrode adjacent to the ferroelectric layer is made of noble metal or platinum-group metal, thereby preventing metals in the electrodes from diffusing into the ferroelectric layer. Through the configuration, the number of oxide vacancies in the ferroelectric layers are prevented from getting increased, thereby reducing leakage of the MFM memory cell, which in turn may achieve better data retention and high breakdown voltage. Another advantage is that metal-containing compound layers (e.g., metal oxide layers), which include noble metal element or platinum-group metal element, can be optionally formed between the electrode and the ferroelectric layer, thereby further reducing the leakage of the MFM memory cell. Still another advantage is that the metal-containing compound layer between the ferroelectric layer and the top/bottom electrode is quite thinned, thereby achieving low parasitic resistance of the MFM memory cell. Still another advantage is that a cap top electrode is form over the noble/platinum-group metal top electrode for preventing tool contamination, such that the fabrication process of the MFM memory cell having the noble/platinum-group metal top and bottom electrodes can be easily combined with logic process as embedded memory without contamination.

According to some embodiments of the present disclosure, a method for fabricating a semiconductor device is provided. The method includes depositing a bottom electrode layer over a substrate; depositing a ferroelectric layer over the bottom electrode layer; depositing a first top electrode layer over the ferroelectric layer, wherein the first top electrode layer comprises a first metal; depositing a second top electrode layer over the first top electrode layer, wherein the second top electrode layer comprises a second metal, and a standard reduction potential of the first metal is greater than a standard reduction potential of the second metal; and removing portions of the second top electrode layer, the first top electrode layer, the ferroelectric layer, and the bottom electrode layer to form a memory stack, the memory stack comprising remaining portions of the second top electrode layer, the first top electrode layer, the ferroelectric layer, and the bottom electrode layer.

According to some embodiments of the present disclosure, a method for fabricating a semiconductor device is provided. The method includes method for fabricating a semiconductor device, comprising: depositing a first bottom electrode layer over an interconnect layer, wherein the first bottom electrode layer comprises a first metal; depositing a second bottom electrode layer over the first bottom electrode layer, wherein the second bottom electrode layer comprises a second metal, and a standard reduction potential of the second metal is greater than a standard reduction potential of the first metal; depositing a ferroelectric layer over the second bottom electrode layer; depositing a top electrode layer over the ferroelectric layer; and removing portions of the top electrode layer, the ferroelectric layer, the second bottom electrode layer, and the first bottom electrode layer to form a memory stack, the memory stack comprising remaining portions of the top electrode layer, the ferro electric layer, the second bottom electrode layer, and the first bottom electrode layer.

According to some embodiments of the present disclosure, a semiconductor device includes a substate; a bottom electrode over the substate; a ferroelectric layer over the bottom electrode; a first top electrode over the ferroelectric layer, wherein the first top electrode layer comprises a first metal; and a second top electrode over the first top electrode, wherein the second top electrode layer comprises the second top electrode comprises a second metal. A standard reduction potential of the first metal is greater than a standard reduction potential of the second metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
depositing a bottom electrode layer over a substrate;
depositing a ferroelectric layer over the bottom electrode layer;
depositing a noble metal layer over the ferroelectric layer;
depositing a non-noble metal layer over the noble metal layer, wherein the non-noble metal layer is free of noble metal; and
removing portions of the non-noble metal layer, the noble metal layer, the ferroelectric layer, and the bottom electrode layer to form a memory stack, the memory stack comprising remaining portions of the non-noble metal layer, the noble metal layer, the ferroelectric layer, and the bottom electrode layer.

2. The method of claim 1, wherein depositing the bottom electrode layer is performed such that the bottom electrode layer comprises non-noble metal.

3. The method of claim 1, wherein depositing the bottom electrode layer is performed such that the bottom electrode layer comprises noble metal.

4. The method of claim 1, further comprising:
depositing an interlayer dielectric layer over the memory stack; and
forming a metallization pattern in the interlayer dielectric layer, wherein the metallization pattern is in contact with the remaining portion of the non-noble metal layer and free of contacting with the remaining portion of the noble metal layer.

5. The method of claim 1, further comprising:
depositing a metal-containing compound layer over the bottom electrode layer prior to depositing the ferroelectric layer, wherein the metal-containing compound layer comprises noble metal.

6. The method of claim 1, further comprising:
oxidizing a surface layer of the bottom electrode layer to form a metal oxide layer prior to depositing the ferroelectric layer.

7. The method of claim 1, further comprising:
depositing a metal-containing compound layer over the ferroelectric layer prior to depositing the noble metal layer, wherein the metal-containing compound layer comprises noble metal.

8. A method for fabricating a semiconductor device, comprising:
depositing a first bottom electrode layer over an interconnect layer, wherein the first bottom electrode layer comprises a first metal;
depositing a second bottom electrode layer over the first bottom electrode layer, wherein the second bottom electrode layer comprises a second metal, and a standard reduction potential of the second metal is greater than a standard reduction potential of the first metal;
depositing a ferroelectric layer over the second bottom electrode layer;
depositing a top electrode layer over the ferroelectric layer; and
removing portions of the top electrode layer, the ferroelectric layer, the second bottom electrode layer, and the first bottom electrode layer to form a memory stack, the memory stack comprising remaining portions of the top electrode layer, the ferroelectric layer, the second bottom electrode layer, and the first bottom electrode layer.

9. The method of claim 8, wherein the first metal is a non-noble metal, and the second metal is a noble metal.

10. The method of claim 8, further comprising:
forming a metal-containing compound layer over the second bottom electrode layer, wherein the metal-containing compound layer comprises a metal the same as the second metal.

11. The method of claim 8, wherein depositing the top electrode layer is performed such that the top electrode layer comprises a metal having a standard reduction potential greater than the standard reduction potential of the first metal.

12. The method of claim 8, wherein removing the portions of the top electrode layer, the ferroelectric layer, the second bottom electrode layer, and the first bottom electrode layer comprises:
etching the portions of the top electrode layer, the ferroelectric layer, the second bottom electrode layer, and the first bottom electrode layer.

13. A method for fabricating a semiconductor device, comprising:
depositing a bottom electrode layer over a substrate, wherein the bottom electrode layer comprises a bottom platinum-group metal layer;
oxidizing a surface layer of the bottom platinum-group metal layer to form a bottom platinum-group metal oxide layer over and in direct contact with a remaining portion of the bottom platinum-group metal layer;

depositing a ferroelectric layer over and in direct contact with a top surface of the bottom platinum-group metal oxide layer;

depositing a top electrode layer over the ferroelectric layer; and removing portions of the top electrode layer, the ferroelectric layer, the bottom platinum-group metal oxide layer, and the bottom electrode layer to form a memory stack.

14. The method of claim 13, wherein the bottom electrode layer further comprises a bottom non-platinum group metal layer below the bottom platinum-group metal layer.

15. The method of claim 13, wherein depositing the top electrode layer comprises:

depositing a top platinum-group metal oxide layer over and in contact with a top surface of the ferroelectric layer.

16. The method of claim 13, wherein depositing the top electrode layer comprises:

depositing a top platinum-group metal layer over and in contact with a top surface of the ferroelectric layer.

17. The method of claim 13, wherein removing portions of the top electrode layer, the ferroelectric layer, the bottom platinum-group metal oxide layer, and the bottom electrode layer comprises:

patterning the top electrode layer into a top electrode;

forming a spacer around the top electrode; and etching the ferroelectric layer, the bottom platinum-group metal oxide layer, and the bottom electrode layer into a ferroelectric element, a platinum-group metal oxide, and a bottom electrode respectively.

18. The method of claim 15, wherein a thickness of the bottom platinum-group metal oxide layer is greater than a thickness of the top platinum-group metal oxide layer.

19. The method of claim 13, wherein depositing the top electrode layer is performed such that the top electrode layer comprises a top platinum-group metal layer over the ferroelectric layer and a top non-platinum group metal layer over the top platinum-group metal layer, and a thickness of the top non-platinum group metal layer is greater than a thickness of the top platinum-group metal layer.

20. The method of claim 1, wherein a thickness of the non-noble metal layer is greater than that of the noble metal layer.

* * * * *